United States Patent
Kim et al.

(10) Patent No.: US 10,249,408 B2
(45) Date of Patent: Apr. 2, 2019

(54) ELECTRICAL CABLE, TERMINAL-EQUIPPED ELECTRICAL CABLE, AND METHOD OF MANUFACTURING TERMINAL-EQUIPPED ELECTRICAL CABLE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Jisung Kim, Mie (JP); Daisuke Hashimoto, Mie (JP)

(73) Assignees: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 18 days.

(21) Appl. No.: 15/542,502

(22) PCT Filed: Jan. 6, 2016

(86) PCT No.: PCT/JP2016/050192
§ 371 (c)(1),
(2) Date: Jul. 10, 2017

(87) PCT Pub. No.: WO2016/114184
PCT Pub. Date: Jul. 21, 2016

(65) Prior Publication Data
US 2018/0268959 A1 Sep. 20, 2018

(30) Foreign Application Priority Data
Jan. 15, 2015 (JP) .................. 2015-005781

(51) Int. Cl.
*H01B 7/02* (2006.01)
*H01B 7/08* (2006.01)
(Continued)

(52) U.S. Cl.
CPC ....... *H01B 7/0823* (2013.01); *B60R 16/0207* (2013.01); *B60R 16/0215* (2013.01);
(Continued)

(58) Field of Classification Search
CPC .......... H01B 7/02; H01B 7/04; H01B 7/0823; H01B 13/06; H01R 4/02; H01R 4/04; H01R 4/18; H01R 43/24
(Continued)

(56) References Cited

U.S. PATENT DOCUMENTS 5,003,126 A * 3/1991 Fujii .................... G02B 6/4403
174/115
5,015,800 A * 5/1991 Vaupotic .............. H01B 11/002
156/51
(Continued)

FOREIGN PATENT DOCUMENTS

JP  2010-135203 A * 6/2010 ............. H01B 13/00
JP  2010135203 A    6/2010
(Continued)

OTHER PUBLICATIONS

International Search Report for Application No. PCT/JP2016/050192 dated Feb. 16, 2016, 5 pages.
(Continued)

Primary Examiner — William H. Mayo, III
(74) Attorney, Agent, or Firm — Reising Ethington, P.C.

(57) ABSTRACT

An electrical cable including conductors and an insulation member that covers a periphery of the conductors, and a technique of facilitating bending of the electrical cable in a plurality of directions. The electrical cable includes an
(Continued)

electrical cable portion having a plurality of linear conductors configured to be connected to a common connection point, and a flexible insulation member configured to cover a periphery of the electrical cable portion. A middle portion between both ends of the electrical cable portion includes a non-twisted portion where at least some among the plurality of linear conductors are provided in a state spaced apart from each other. The insulation member covers a periphery of the non-twisted portion of the electrical cable portion, and fills gaps between the plurality of linear conductors in the non-twisted portion.

8 Claims, 13 Drawing Sheets

(51) Int. Cl.
| | |
|---|---|
| *H01R 4/18* | (2006.01) |
| *H01B 13/06* | (2006.01) |
| *H01R 4/70* | (2006.01) |
| *H01R 43/24* | (2006.01) |
| *H05K 9/00* | (2006.01) |
| *B60R 16/02* | (2006.01) |
| *H01R 13/405* | (2006.01) |
| *H01B 7/04* | (2006.01) |

(52) U.S. Cl.
CPC ............... *H01B 13/06* (2013.01); *H01R 4/18* (2013.01); *H01R 4/70* (2013.01); *H01R 13/405* (2013.01); *H01R 43/24* (2013.01); *H05K 9/0098* (2013.01); *H01B 7/04* (2013.01)

(58) Field of Classification Search
USPC ...... 174/117 F, 117 FF, 117 R, 110 R, 113 R
See application file for complete search history.

(56) References Cited

U.S. PATENT DOCUMENTS

| | | | | |
|---|---|---|---|---|
| 5,304,741 | A * | 4/1994 | Proulx | H01B 7/0823 174/110 FC |
| 5,401,908 | A * | 3/1995 | Rodeghero | H01B 7/361 174/112 |
| 5,455,383 | A * | 10/1995 | Tanaka | H01B 7/0861 174/117 A |
| 5,554,825 | A * | 9/1996 | Parker | H01B 7/0861 174/117 A |
| 6,717,058 | B2 * | 4/2004 | Booth | H01B 7/0876 174/117 F |
| 7,868,254 | B2 * | 1/2011 | Matsushita | H01B 7/0861 174/117 FF |
| 2001/0004557 | A1 * | 6/2001 | Scheideler | H01B 7/0861 439/67 |
| 2004/0011553 | A1 * | 1/2004 | Cianciolo | H01B 7/0838 174/117 FF |
| 2009/0236122 | A1 * | 9/2009 | Yeh | H01B 7/0838 174/117 F |
| 2010/0243292 | A1 * | 9/2010 | Telley | H01B 13/0023 174/117 F |
| 2014/0000927 | A1 | 1/2014 | Hashimoto | |

FOREIGN PATENT DOCUMENTS

| | | |
|---|---|---|
| JP | 2011014427 A | 1/2011 |
| JP | 2012182047 A | 9/2012 |

OTHER PUBLICATIONS

International Search Report for Application No. PCT/JP2016/050192, 4 pages.

* cited by examiner

ELECTRICAL CABLE, TERMINAL-EQUIPPED ELECTRICAL CABLE, AND METHOD OF MANUFACTURING TERMINAL-EQUIPPED ELECTRICAL CABLE

CROSS REFERENCE TO RELATED APPLICATIONS

This application claims the priority of Japanese patent application JP2015-005781 filed on Jan. 15, 2015, the entire contents of which are incorporated herein.

TECHNICAL FIELD

The present invention relates to an electrical cable including an electrical cable portion and an insulation member, a terminal-equipped electrical cable including the electrical cable, and a method of manufacturing the terminal-equipped electrical cable.

BACKGROUND ART

In a wire harness to be installed in a vehicle such as an automobile, for example, as disclosed in Patent Document 1 (JP2012-182047A), an insulation member may be provided at a periphery of a metal conductor (bus bar). In an example disclosed in Patent Document 1, the bus bar has a layered structure in which a plurality of conductors are layered, and the bus bar is flexible in the thickness direction of the layered structure.

Also, in the example disclosed in Patent Document 1, the insulation member is a flexible member that covers the periphery of a middle area other than both end portions of the bus bar. The insulation member is formed by insert-molding using the middle area of the bus bar as an insert portion.

Also, Patent Document 2 (JP2010-135203A) discloses a flat electrical cable provided with a plurality of electrical cable portions having a plurality of wire strands arranged in parallel in a state contacting each other, and an insulation member that is formed by extrusion molding and covers the plurality of electrical cable portions. Also, Patent Document 2 discloses a case of crimping a terminal to an end portion of the flat electrical cable.

SUMMARY

Incidentally, in the example disclosed in Patent Document 1, the bus bar has a layered structure in which a plurality of conductors are layered in contact with each other, and the insulation member covers the periphery of the bus bar having this layered structure, so it is not sufficiently easy to bend the bus bar in the direction in which the plurality of conductors are layered.

Also, in the example disclosed in Patent Document 2, the electrical cable portions include a plurality of wire strands arranged in parallel in a state contacting each other. Further, the insulation member covers the periphery of the electrical cable portions. Therefore, there is a concern that the flat electrical cable disclosed in Patent Document 2 is difficult to bend in a direction orthogonal to an extension direction of the electrical cable portions (the direction in which the wire strands are arranged). In this case, for example, in a state in which one end portion of the flat electrical cable disclosed in Patent Document 2 is fixed, it is difficult to move a terminal connected to the other end portion in the direction in which the wire strands are arranged.

It is an object of the present design to provide, regarding an electrical cable including conductors and an insulation member that covers a periphery of the conductors, a technique of facilitating bending of the electrical cable in a plurality of directions, and improving flexibility of the electrical cable.

An electrical cable according to a first aspect is provided with an electrical cable portion having a plurality of linear conductors configured to be connected to a common connection point; and a flexible insulation member configured to cover a periphery of the electrical cable portion; a middle portion between both ends of the electrical cable portion having a non-twisted portion where at least some among the plurality of linear conductors are provided in a state spaced apart from each other, and the insulation member covering a periphery of the non-twisted portion of the electrical cable portion, and filling gaps between the plurality of linear conductors in the non-twisted portion.

An electrical cable according to a second aspect is one aspect of the electrical cable according to the first aspect. In the electrical cable according to the second aspect, in the non-twisted portion, the plurality of linear conductors are arranged in parallel in a direction orthogonal to an extension direction of the electrical cable portion.

An electrical cable according to a third aspect is one aspect of the electrical cable according to the first aspect or the second aspect. In the electrical cable according to the third aspect, the insulation member is formed in a flat shape.

An electrical cable according to a fourth aspect is one aspect of the electrical cable according to any one of the first aspect to the third aspect. The electrical cable according to the fourth aspect is provided with a plurality of the electrical cable portions, and in a state in which the plurality of electrical cable portions are arranged in parallel with a space between each other, the plurality of electrical cable portions are collectively covered by the insulation member.

An electrical cable according to a fifth aspect is one aspect of the electrical cable according to any one of the first aspect to the fourth aspect. The electrical cable according to the fifth aspect is further provided with a shield portion that covers at least one side of the electrical cable portion, and is formed integrated with the electrical cable portion by the insulation member.

A terminal-equipped electrical cable according to a sixth aspect is provided with the electrical cable according to any one of the first aspect to the fifth aspect; and at least one terminal connected to an end portion of the electrical cable portion; the electrical cable portion further including, in a connection portion thereof connecting with the terminal, a twisted portion where the plurality of linear conductors are provided in a twisted state.

A terminal-equipped electrical cable according to a seventh aspect is one aspect of the terminal-equipped electrical cable according to the sixth aspect. The terminal-equipped electrical cable according to the seventh aspect further includes a molded portion that covers a periphery of the connection portion connecting the electrical cable portion and the terminal.

A terminal-equipped electrical cable manufacturing method according to an eighth aspect is a terminal-equipped electrical cable manufacturing method of manufacturing the terminal-equipped electrical cable according to the sixth aspect, employing a mold in which a space is formed surrounded by an inside face that follows a contour of the insulation member and the space is capable of accommodating the non-twisted portion, the method including: connecting the terminal to the twisted portion of the electrical cable portion; and molding the insulation member that covers a periphery of the non-twisted portion and fills gaps between the plurality of linear conductors in the non-twisted portion by injecting a molding resin into the space while maintaining a state in which the non-twisted portion is not in contact with an inside face of the mold, and a state in which at least some among the plurality of linear conductors are spaced apart from each other.

In each of the above embodiments, the electrical cable portion includes the non-twisted portion, and the insulation member fills gaps between the plurality of linear conductors in the non-twisted portion. In this case, in the non-twisted portion of the electrical cable portion, the force necessary to bend the plurality of linear conductors provided in a dispersed state is small. Also, with the flexible insulation member that fills gaps between the plurality of linear conductors in the non-twisted portion, it is possible to suppress the plurality of linear conductors in a dispersed state from coming into contact with each other and becoming difficult to bend. In this case, the electrical cable bends easily in a plurality of directions, and the flexibility of the electrical cable can be improved.

Also, in the second aspect, in the non-twisted portion, the plurality of linear conductors are arranged in parallel in a direction orthogonal to the extension direction of the electrical cable portion. Conventionally, when a plurality of linear conductors are arranged in parallel in a state in contact with each other, the linear conductors are difficult to bend in the direction in which they are arranged. On the other hand, in the electrical cable of the second aspect, the linear conductors arranged in parallel are partitioned by the flexible insulation member, so this electrical cable bends easily also in the direction in which the linear conductors are arranged. That is, the electrical cable including the electrical cable portion in which the plurality of linear conductors are arranged in parallel is prevented from being difficult to bend in a direction orthogonal to the extension direction of the electrical cable portion (the direction in which the linear conductors are arranged). As a result, the electrical cable bends easily in a plurality of directions, and the flexibility of the electrical cable can be improved.

Also, in the third aspect, the insulation member is provided in a flat shape, so the electrical cable can be easily laid in a location such as a gap having a small amount of space.

Also, in the fourth aspect, in a state in which the plurality of electrical cable portions are arranged in parallel with a space between each other, the plurality of electrical cable portions are collectively covered by the insulation member. In this case, the plurality of electrical cable portions can be integrated together by the insulation member, so the handling performance of the electrical cable is increased.

Also, in the fifth aspect, the electrical cable is further provided with a shield portion that covers at least one side of the electrical cable portion, and is formed integrated with the electrical cable portion by the insulation member. In this case, electromagnetic noise from at least one side of the electrical cable portion can be shielded.

Also, in the sixth aspect, the electrical cable portion further includes, in a connection portion thereof connecting with the terminal, a twisted portion where the plurality of linear conductors are provided in a twisted state. In this case, the plurality of linear conductors are not dispersed in the connection portion connecting with the terminal, so it is possible to efficiently perform the work of connecting the electrical cable portion to the terminal, and the connection state of the electrical cable portion with the terminal is stable.

Also, in the seventh aspect, water can be stopped in the connection portion connecting the terminal and the electrical cable portion by the molded portion, which covers the connection portion connecting the terminal and the electrical cable portion.

Also, in the eighth aspect, the method of manufacturing the terminal-equipped electrical cable includes molding the insulation member that covers a periphery of the non-twisted portion and fills gaps between the plurality of linear conductors in the non-twisted portion by injecting a molding resin into the space while maintaining a state in which the non-twisted portion is not in contact with an inside face of the mold, and a state in which at least some among the plurality of linear conductors are spaced apart from each other. In this case, it is possible to easily manufacture the terminal-equipped electrical cable including the insulation member that covers the periphery of the non-twisted portion of the electrical cable portion, and fills gaps between the plurality of linear conductors in the non-twisted portion.

DESCRIPTION OF EMBODIMENTS

Figure 1:
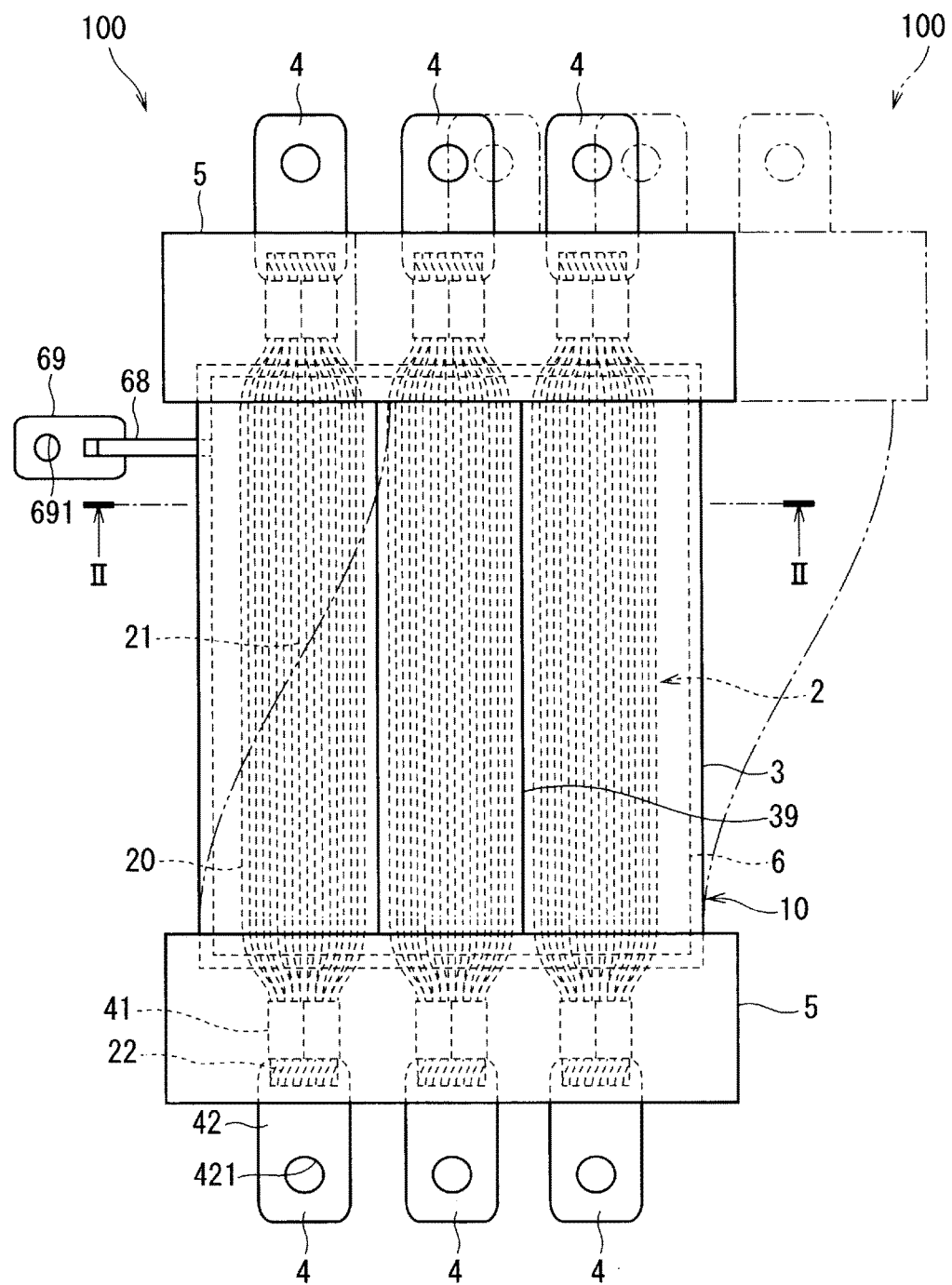
FIG. 1 is a plan view of a terminal-equipped electrical cable according to a first embodiment.

Below, embodiments will be described with reference to the accompanying drawings. The following embodiments are only examples embodying the present invention, and do not limit the technical scope of the present invention.

First Embodiment

First, a terminal-equipped electrical cable 100 according to a first embodiment will be described with reference to FIGS. 1 to 4. The terminal-equipped electrical cable 100 includes an electrical cable 10 and at least one terminal 4. The electrical cable 10 includes an electrical cable portion 2 and an insulation member 3. Note that at least one terminal 4 is connected to an end portion of the electrical cable portion 2.

Also, in the present embodiment, the terminal-equipped electrical cable 100 further includes a molded portion 5. Also, in the present embodiment, the electrical cable 10 in the terminal-equipped electrical cable 100 further includes a shield portion 6. The terminal-equipped electrical cable 100 is to be installed in a vehicle such as an automobile, for example.

Figure 2:
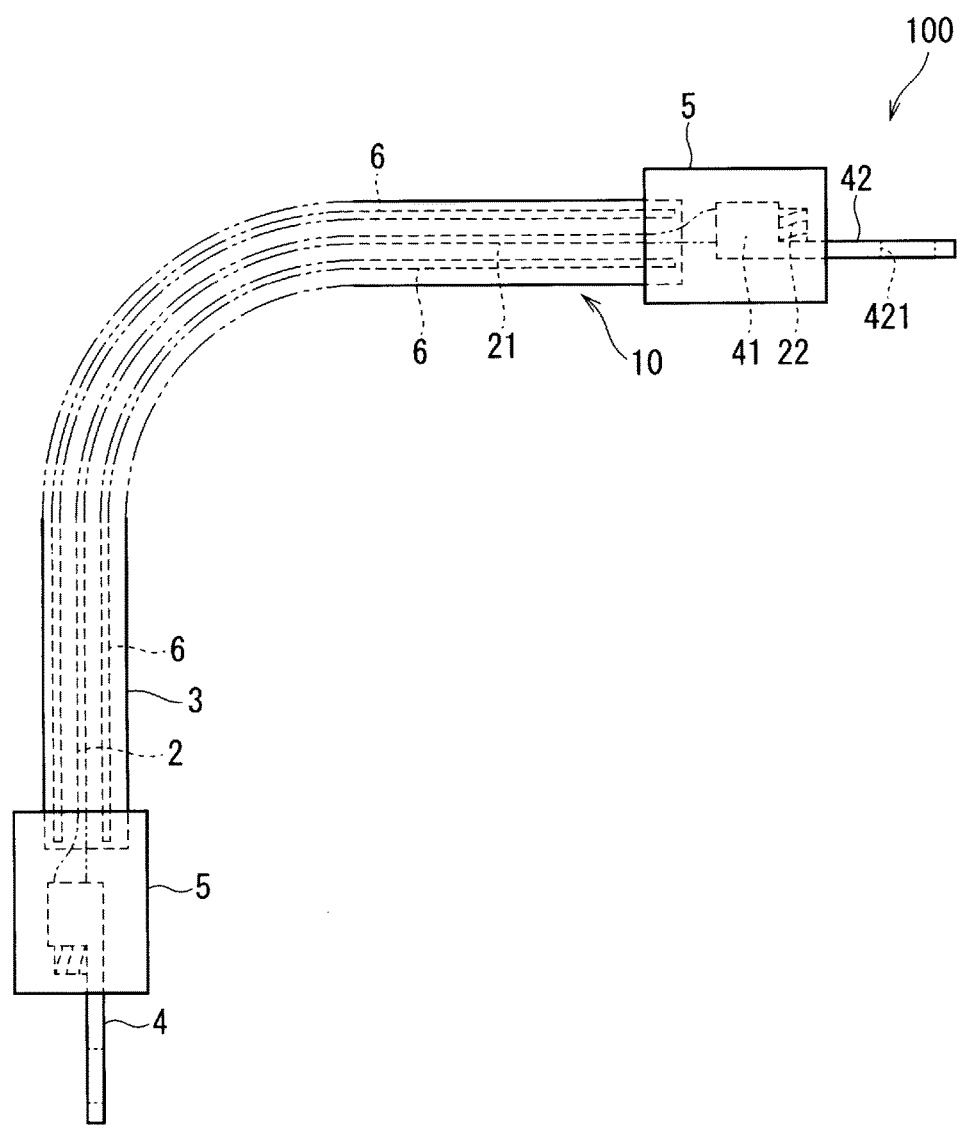
FIG. 2 is a side view of the terminal-equipped electrical cable according to the first embodiment.
Figure 3:
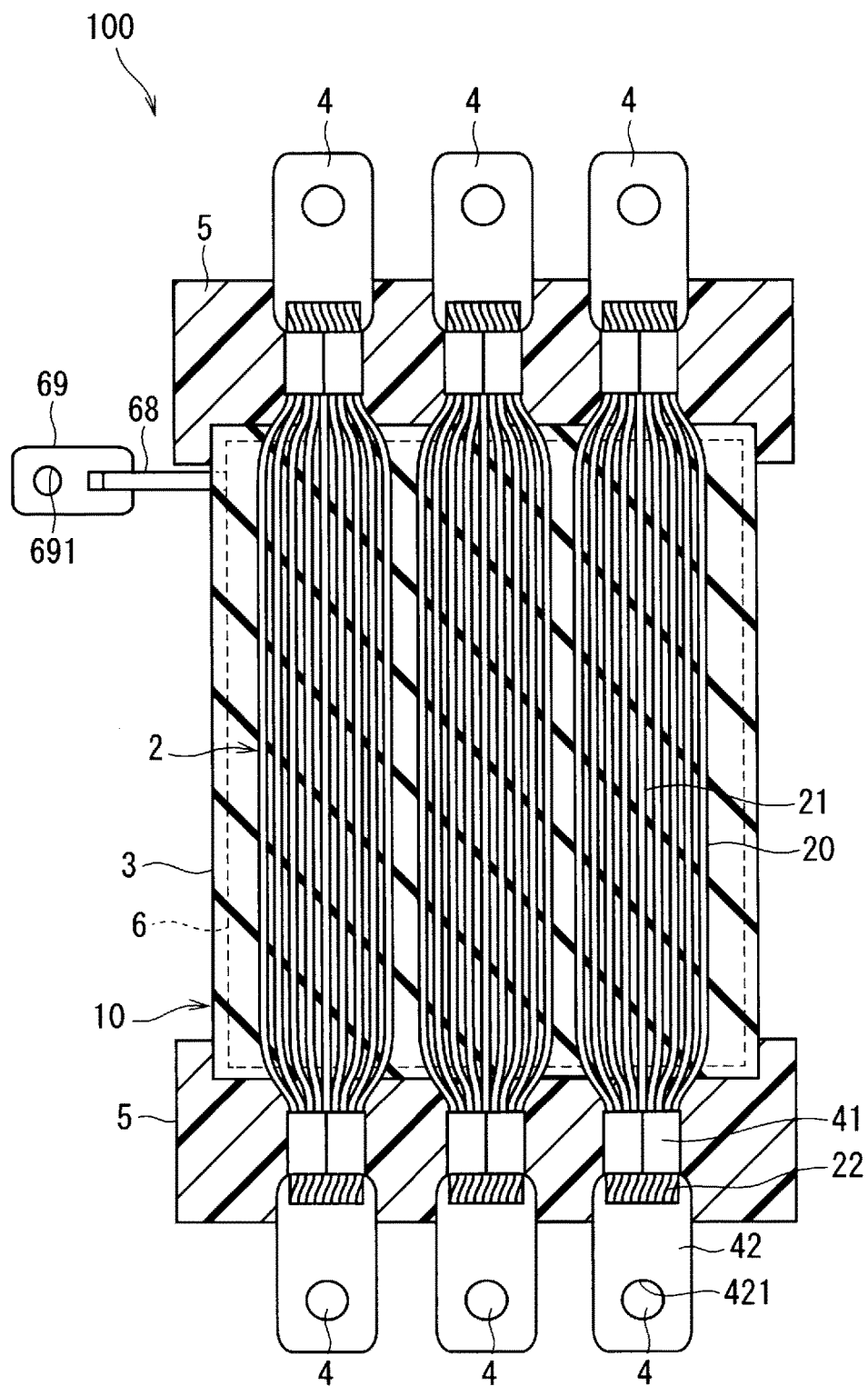
FIG. 3 is a partial cutaway plan view of the terminal-equipped electrical cable according to the first embodiment.
Figure 4:
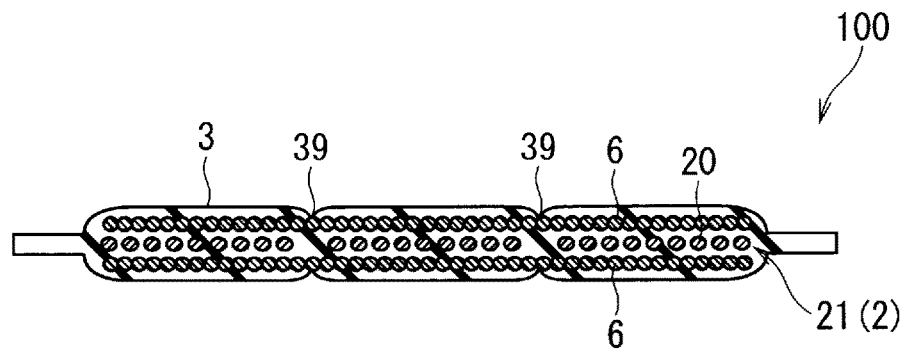
FIG. 4 is a cross-sectional view of the terminal-equipped electrical cable according to the first embodiment.

FIG. 1 is a plan view of the terminal-equipped electrical cable 100. FIG. 2 is a side view of the terminal-equipped electrical cable 100. Note that FIG. 2 shows the terminal-equipped electrical cable 100 in a bent state. FIG. 3 is a partial cutaway plan view of the terminal-equipped electrical cable 100. FIG. 4 is a cross-sectional view of the terminal-equipped electrical cable 100. Note that FIG. 4 is a cross-sectional view of the terminal-equipped electrical cable 100 in plane II-II of FIG. 1.

The electrical cable 10 is provided with the electrical cable portion 2, which includes a plurality of linear conductors 20, and the flexible insulation member 3, which covers a periphery of the electrical cable portion 2. Also, in the present embodiment, the electrical cable 10 is provided with a plurality of the electrical cable portions 2. As shown in FIGS. 1, 3, and 4, in the present embodiment, the electrical cable 10 included in the terminal-equipped electrical cable 100 is provided with three of the electrical cable portions 2. Note that cases are also conceivable in which the number of electrical cable portions 2 included in the electrical cable 10 is one, two, or four or more.

In the terminal-equipped electrical cable 100, the electrical cable portion 2 includes a plurality of the linear conductors 20 connectable to a common connection point. Note that in the present embodiment, the common connection point of the plurality of linear conductors 20 is the terminal 4.

Also, in the terminal-equipped electrical cable 100, the electrical cable portion 2 is provided with a non-twisted portion 21. Note that in the present embodiment, the electrical cable portion 2 is also provided with a twisted portion 22. The non-twisted portion 21 is a portion in which, in a middle portion between both ends, at least some of the plurality of linear conductors 20 are provided in a state spaced apart from each other. That is, in the non-twisted portion 21, at least some adjacent linear conductors 20 among the plurality of linear conductors 20 are disposed with a space between them. The twisted portion 22 is a portion in which, in a connection portion connecting with the terminal 4, a plurality of the linear conductors 20 are provided in a twisted state.

For example, the non-twisted portion 21 of the electrical cable portion 2 can be obtained by untwisting the middle portion of the plurality of linear conductors 20 twisted over their entire length in advance.

Also, in the present embodiment, a case is disclosed in which the plurality of linear conductors 20 in the non-twisted portion 21 are arranged in parallel in a direction orthogonal to the extension direction of the electrical cable portion 2. As shown in FIGS. 1 and 2, in the present embodiment, the direction in which the plurality of linear conductors 20 in the non-twisted portion 21 are arranged is a direction extending in the width direction of the terminal 4. Note that the direction in which the plurality of linear conductors 20 in the non-twisted portion 21 are arranged also extends in the direction in which the plurality (in this example, three) of electrical cable portions 2 are arranged.

That is, in the present embodiment, the non-twisted portion 21 is provided in a flat shape. As shown in FIGS. 1 and 2, in a case where a plurality of the linear conductors 20 are arranged spaced apart from each other in one direction, the thickness dimension of the non-twisted portion 21 can be reduced, and therefore the non-twisted portion 21 easily bends in the thickness direction. Also note that the thickness direction of the non-twisted portion 21 is a direction orthogonal to the longitudinal direction of the electrical cable portion 2, and is a direction extending in the thickness direction of the terminal 4. The thickness dimension is a dimension in the above-described thickness direction.

Note that a case is also conceivable in which, in the non-twisted portion 21, a plurality of the linear conductors 20 are arranged in parallel in a direction other than described above. Also, a case is also conceivable in which, in the non-twisted portion 21, a plurality of the linear conductors 20 are irregularly arranged in a state in which at least some of the linear conductors 20 are spaced apart from each other.

Further, as shown in FIG. 4, gaps are formed between adjacent linear conductors 20 among the linear conductors 20 arranged in parallel. Also, the insulation member 3 is provided in the gaps between the linear conductors 20.

In this regard, in the present embodiment, it is sufficient that a gap is formed at least at a portion between the adjacent linear conductors 20. That is, in the longitudinal direction of the electrical cable portion 2, it is not necessary that a gap is formed between the adjacent linear conductors 20 over their entire length. That is, a gap is formed at least at a portion between the adjacent linear conductors 20 in the longitudinal direction of the electrical cable portion 2. Therefore, for example, it is also conceivable that the adjacent linear conductors 20 partially contact each other. Of course, it is also conceivable that in the longitudinal direction of the electrical cable portion 2, a gap is formed between the adjacent linear conductors 20 over their entire length.

Next, the twisted portion 22 of the electrical cable portion 2 will be described. The twisted portion 22 is a portion in which a plurality of the linear conductors 20 are twisted, that is, a portion in which a plurality of the linear conductors 20 are gathered together in contact with each other. The terminal 4 is connectable to the twisted portion 22. In a case where the terminal 4 is connectable to the twisted portion 22, the plurality of linear conductors 20 are gathered together in the twisted portion 22, so the connection state with the terminal 4 is stable.

As described above, in the present embodiment, the non-twisted portion 21 of the electrical cable portion 2 can be obtained by untwisting the middle portion of the plurality of linear conductors 20 twisted over their entire length in advance. In this case, the twisted portion 22 is a portion where a plurality of the linear conductors 20 have been twisted in advance, and where twisting of the plurality of linear conductors 20 is not untwisted. In the present embodiment, the twisted portion 22 is provided by the terminal 4 being connected to an end portion of the plurality of linear conductors 20 twisted in advance.

Therefore, in the terminal-equipped electrical cable 100, the electrical cable portion 2 has respective twisted portions 22 at both end portions of the electrical cable portion 2, and the non-twisted portion 21 in a portion between the twisted portions 22.

It is also conceivable that the twisted portions 22 of the electrical cable portion 2 are produced by a method other than described above. For example, a case is also conceivable in which a plurality of the linear conductors 20 are arranged in parallel spaced apart from each other in advance, and the twisted portions 22 are provided by, for example, gathering the end portions of the plurality of linear conductors 20 and twisting them together. In this case, the portion between both ends of the plurality of linear conductors 20, that is, the portion where the plurality of linear conductors 20 are not gathered, is the non-twisted portion 21.

In the present embodiment, a case is disclosed in which the terminal-equipped electrical cable 100 includes a plurality (in this example, three) of the electrical cable portions 2. As shown in FIGS. 1 and 3, the plurality of electrical cable portions 2 are arranged in parallel with a space between them. In this state, the plurality of electrical cable portions 2 are collectively covered with the insulation member 3 described later. Therefore, in the terminal-equipped electrical cable 100, the plurality of electrical cable portions 2 are kept in a state with a space between them.

The linear conductors 20 included in the electrical cable portion 2 are flexible metal members. Note that the linear conductors 20 can also be referred to as bare conductors. It is conceivable that the linear conductors 20 are thin linear members whose main component is a metal such as copper or aluminum, for example.

In the terminal-equipped electrical cable 100, the insulation member 3 is a flexible member that covers the periphery of the electrical cable portion 2. More specifically, the insulation member 3 covers the periphery of the non-twisted portion 21 of the electrical cable portion 2. Note that the insulation member 3 does not cover the twisted portions 22 of the electrical cable portion 2. In the present embodiment, the insulation member 3 collectively covers the periphery of the non-twisted portion 21 of a plurality (in this example, three) of the electrical cable portions 2.

Also, the insulation member 3 fills gaps between the plurality of linear conductors 20 in the non-twisted portion 21. That is, a state is created in which in the non-twisted portion 21, the periphery of one linear conductor 20 is surrounded by the insulation member 3.

Also, in the present embodiment, the insulation member 3 is formed in a flat shape. In the terminal-equipped electrical cable 100, the insulation member 3 is thinly formed in the thickness direction of the insulation member 3, and thickly formed in the direction in which the electrical cable portions 2 are arranged. Note that the thickness direction of the insulation member 3 is a direction extending in the thickness direction of the non-twisted portion 21. The insulation member 3 having such a flat shape is easy to bend in the thickness direction of the insulation member 3. Note that in the present embodiment, the insulation member 3 is a flexible member that is sufficiently bendable not only in the direction in which the plurality of electrical cable portions 2 are arranged, but also in other directions.

Also, grooves 39 are formed between portions covering each of the plurality of electrical cable portions 2 in the insulation member 3. In this case, the grooves 39 are provided between adjacent electrical cable portions 2, so the approximate position of the plurality of electrical cable portions 2 inside the insulation member 3 can be inferred from outside of the insulation member 3.

The insulation member 3 is obtained by, for example, insert-molding resin constituting the insulation member 3 with the electrical cable portion 2 as an inserted product. Note that work to provide the insulation member 3 is performed while maintaining a state in which at least some of the plurality of linear conductors 20 of the non-twisted portion 21 of the electrical cable portions 2 are spaced apart from each other. This makes it possible to create a state in which the insulation member 3 fills the gap between the linear conductors 20. This will be described in detail later.

Note that it is conceivable that the insulation member 3 is, for example, a resin member containing an elastomer or a silicone rubber.

In the terminal-equipped electrical cable 100, a terminal 4 is connected to an end portion of an electrical cable portion 2. Also note that the terminal 4 is connected to a twisted portion 22 of the electrical cable portion 2.

The terminal-equipped electrical cable 100 is provided with at least one terminal 4, and a terminal 4 is connectable to each of the plurality of electrical cable portions 2. That is, in the present embodiment, a case is disclosed in which the terminal-equipped electrical cable 100 is provided with six of the terminals 4 respectively connected to both end portions of the three electrical cable portions 2.

In the present embodiment, the terminal 4 includes an electrical cable connection portion 41 connected to the twisted portion 22 of the electrical cable portion 2, and a contact portion 42 connectable to a counterpart-side connection portion, which is a connection counterpart of the terminal 4.

In the present embodiment, the electrical cable connection portion 41 is a portion connected to the twisted portion 22 of the electrical cable portion 2. As shown in FIGS. 1 to 3, the electrical cable connecting portion 41 is connected to the twisted portion 22 of the electrical cable portion 2 by crimping. That is, in the present embodiment, the electrical cable connection portion 41 includes crimping pieces crimped in a state covering the periphery of the twisted portion 22 of the electrical cable portion 2. Note that because the twisted portion 22 is a portion where the plurality of linear conductors 20 are gathered, it is possible to easily perform the work of crimping to the electrical cable connection portion 41, and the connection state with the electrical cable connection portion 41 is stable.

Note that a case is also conceivable in which the twisted portion 21 of the electrical cable portion 2 is connectable to the terminal 4 by welding such as ultrasonic welding or heat welding. In this case, it is conceivable that the electrical cable connection portion 41 is formed in a flat plate-like shape.

Also, in the present embodiment, the contact portion 42 is formed extending from the electrical cable connection portion 41 to the side opposite to the electrical cable portion 2 side in the longitudinal direction of the electrical cable portion 2. Also, as shown in FIGS. 1 and 3, the contact portion 42 includes a fastening hole 421 that enables fastening to a counterpart-side member by a bolt. The fastening hole 421 is a through-hole that passes through from one main face of the terminal 4 to the other main face. In this case, it is also conceivable that a fastening hole allowing fastening of the bolt to the terminal 4 is also formed in the counterpart-side member. Also, it is conceivable that in a state in which the fastening hole 421 of the contact portion 42 of the terminal 4 and the fastening hole of the counterpart-side member are overlapping, the terminal 4 and the counterpart-side member can be connected by inserting a bolt through the holes and tightening the bolt.

In the terminal-equipped electrical cable 100, the molded portion 5 covers the periphery of the connection portion connecting the terminal 4 to the electrical cable portion 2. In the present embodiment, the molded portion 5 covers the electrical cable connection portion 41 of the terminal 4 and the twisted portion 22 of the electrical cable portion 2. That is, the molded portion 5 is formed in an annular shape covering the periphery of the electrical cable connection portion 41 of the terminal 4 and the twisted portion 22 of the electrical cable portion 2. Note that the molded portion 5 does not cover the periphery of the contact portion 42 of the terminal 4.

In the present embodiment, the molded portion 5 collectively covers a plurality (in this example, three) of the electrical cable portions 2 and three of the terminals 4 connected to respective end portions of the electrical cable portions 2. Therefore, as shown in FIGS. 1 and 2, in the present embodiment, the terminal-equipped electrical cable 100 includes two of the molded portions 5 provided at end portions of each electrical cable portion 2.

Note that a case is also conceivable in which the molded portions 5 are individually provided so as to cover the periphery of the twisted portions 22 of the plurality of electrical cable portions 2 and the terminals 4 connected to the twisted portions 22.

Regarding the contour shape of the molded portion 5, it is conceivable that, for example, the molded portion 5 is formed in a shape that can be fitted into an opening portion of a housing accommodating the counterpart-side member that is the connection counterpart of the terminal-equipped electrical cable 100. For example, a case is conceivable in which the contour shape of the molded portion 5 is an oblong shape with rounded corners, a rectangular shape, a circular shape, or the like. Also, depending on the shape of the opening portion of the housing, a case is also conceivable in which a protruding portion or a recessed portion that can be fitted into the opening portion is formed at an outer circumferential face of the molded portion 5, for example.

Also, in the terminal-equipped electrical cable 100, as the molding resin that forms the molded portion 5, it is conceivable to use a PPS (polyphenylene sulfide) resin, a PPA (polyphthalamide) resin, an LCP resin (liquid crystal polymer), a phenol-based resin, a polyester-based resin, a polyamide-based resin, an epoxy-based resin, or a PBT (polybutylene terephthalate) resin.

In the terminal-equipped electrical cable 100, the shield portion 6 covers at least one side of the electrical cable portions 2. Also, the shield portion 6 is formed integrated with the electrical cable portions 2 by the insulation member 3.

In the present embodiment, shield portions 6 are formed in a sheet-like shape covering both sides of the plurality of electrical cable portions 2. Note that in the present embodiment, as shown in FIGS. 1 to 3, the terminal-equipped electrical cable 100 is provided with two of the shield portions 6 having a size capable of respectively covering both sides of a plurality (three in this example) of the electrical cable portions 2. That is, the plurality of electrical cable portions 2 are interposed between the two shield portions 6. However, a case is also conceivable in which the terminal-equipped electrical cable 100 is provided with a plurality of shield portions 6 covering each of the plurality of electrical cable portions 2.

In the present embodiment, the shield portion 6 is a sheet-like metal member. Also, the shield portion 6 is a flexible metal member. In the present embodiment, a case is disclosed in which the shield portion 6 is a member in which a plurality of linear metals are knitted in a sheet-like shape. Note that a case is also conceivable in which, for example, the shield portion 6 is a metal foil containing a flexible metal such as aluminum.

Also, in the present embodiment, the shield portion 6 is provided integrated with the electrical cable portions 2 by the insulation member 3. Therefore, the shield portion 6 covers the non-twisted portion 21 of the electrical cable portions 2 from one side and does not cover the twisted portions 22.

In the present embodiment, electromagnetic noise from electrical equipment existing at the periphery of the electrical cable portions 2 can be shielded by the shield portions 6 provided on both sides of the electrical cable portions 2.

Note that a case is also conceivable in which the shield portion 6 is provided only on one side of the electrical cable portions 2. In this case, electromagnetic noise from electrical equipment existing on one side of the electrical cable portions 2 can be shielded. Also conceivable is a case in which the shield portion 6 is a sheet-like member bent into a cylindrical shape covering the periphery of the electrical cable portions 2, or a case in which the shield portion 6 is a cylindrical member covering the periphery of the electrical cable portions 2.

Also, in the present embodiment, a grounding conductor 68 for grounding is connected to the shield portion 6. The grounding conductor 68 is a member that connects the shield portion 6 inside the insulation member 3 to a connection point (a grounding point) outside of the insulation member 3. The grounding conductor 68 includes, for example, a metal conductor. A case is also conceivable in which the grounding conductor 68 is a metal conductor whose periphery is covered with an insulating coating.

One end portion of the grounding conductor 68 is connected to the shield portion 6. Also note that an end portion on one side of the grounding conductor 68 can be connected to two of the shield portions 6.

On the other hand, a grounding terminal 69 for grounding is connected to an end portion on the other side of the grounding conductor 68. The grounding terminal 69 and the grounding conductor 68 are connected by welding, crimping, or the like. A hole 691 connectable to a connection point (a grounding point) is formed in the grounding terminal 69.

In the present embodiment, the grounding conductor 68 and the shield portion 6 are connected by welding. However, a case is also conceivable in which the grounding conductor 68 and the shield portion 6 are connected by crimping or the like. Also, a case is conceivable in which the grounding conductor 68 is a part of the shield portion 6, that is, a portion protruding to the outside of the insulation member 3 in the shield portion 6.

Next, an example of a method of manufacturing the terminal-equipped electrical cable 100 will be described with reference to FIGS. 5 to 10. The method of manufacturing the terminal-equipped electrical cable according to this embodiment includes a step (a first step) of connecting the terminals 4 to the twisted portions 22 of the electrical cable portions 2, and an insulation member molding step of molding the insulation member 3 that covers the periphery of the non-twisted portion 21 and fills gaps between the plurality of linear conductors 20 in the non-twisted portion 21 by injecting a molding resin into a space inside the mold while maintaining a state in which the non-twisted portion 21 is not in contact with an inside face of a mold and a state in which at least some of the plurality of linear conductors 20 are spaced apart from each other.

Figure 5:
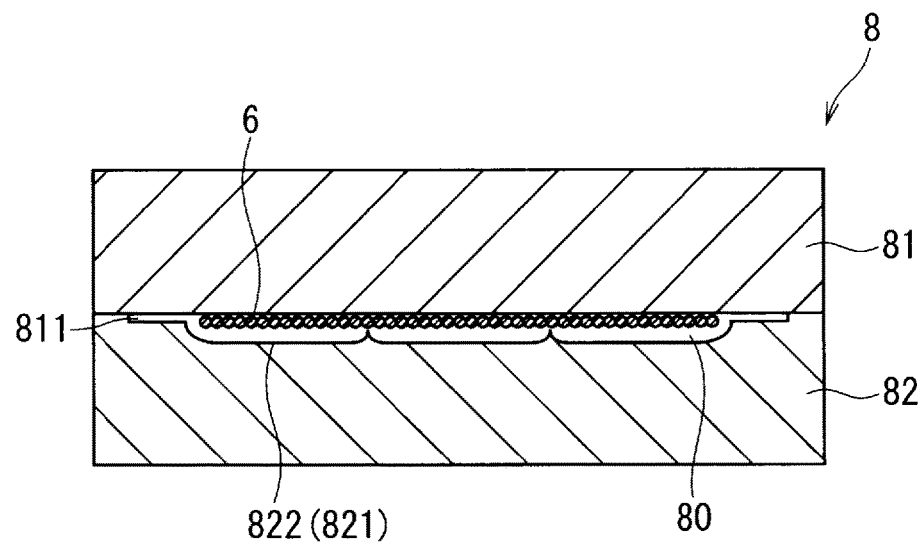
FIG. 5 is a cross-sectional view showing part of a manufacturing process of the terminal-equipped electrical cable according to the first embodiment.
Figure 6:
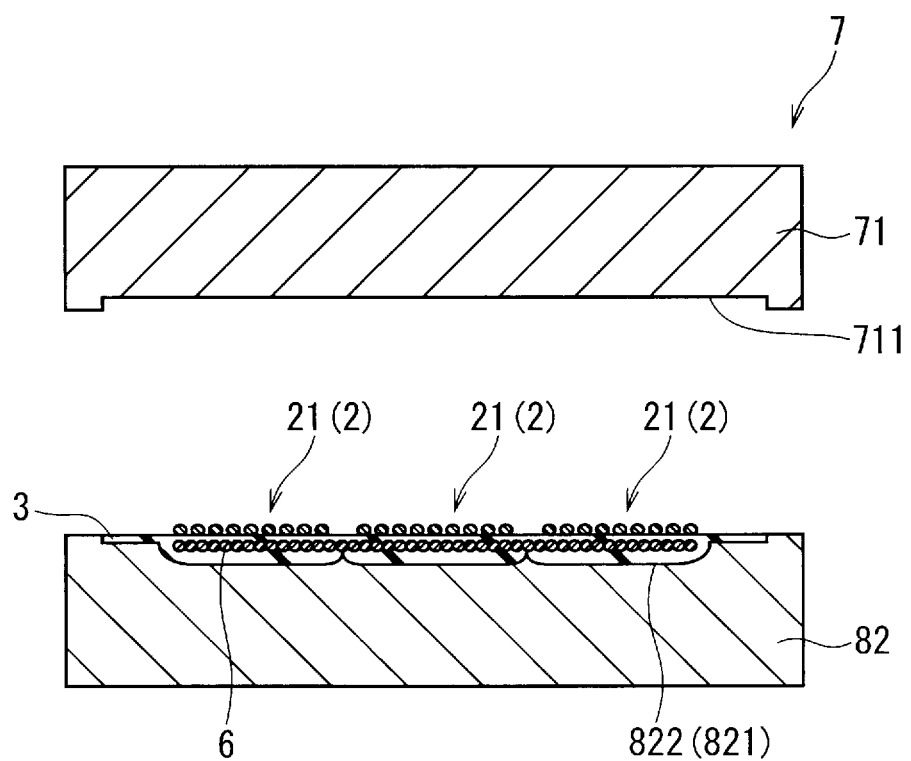
FIG. 6 is a cross-sectional view showing part of the manufacturing process of the terminal-equipped electrical cable according to the first embodiment.
Figure 7:
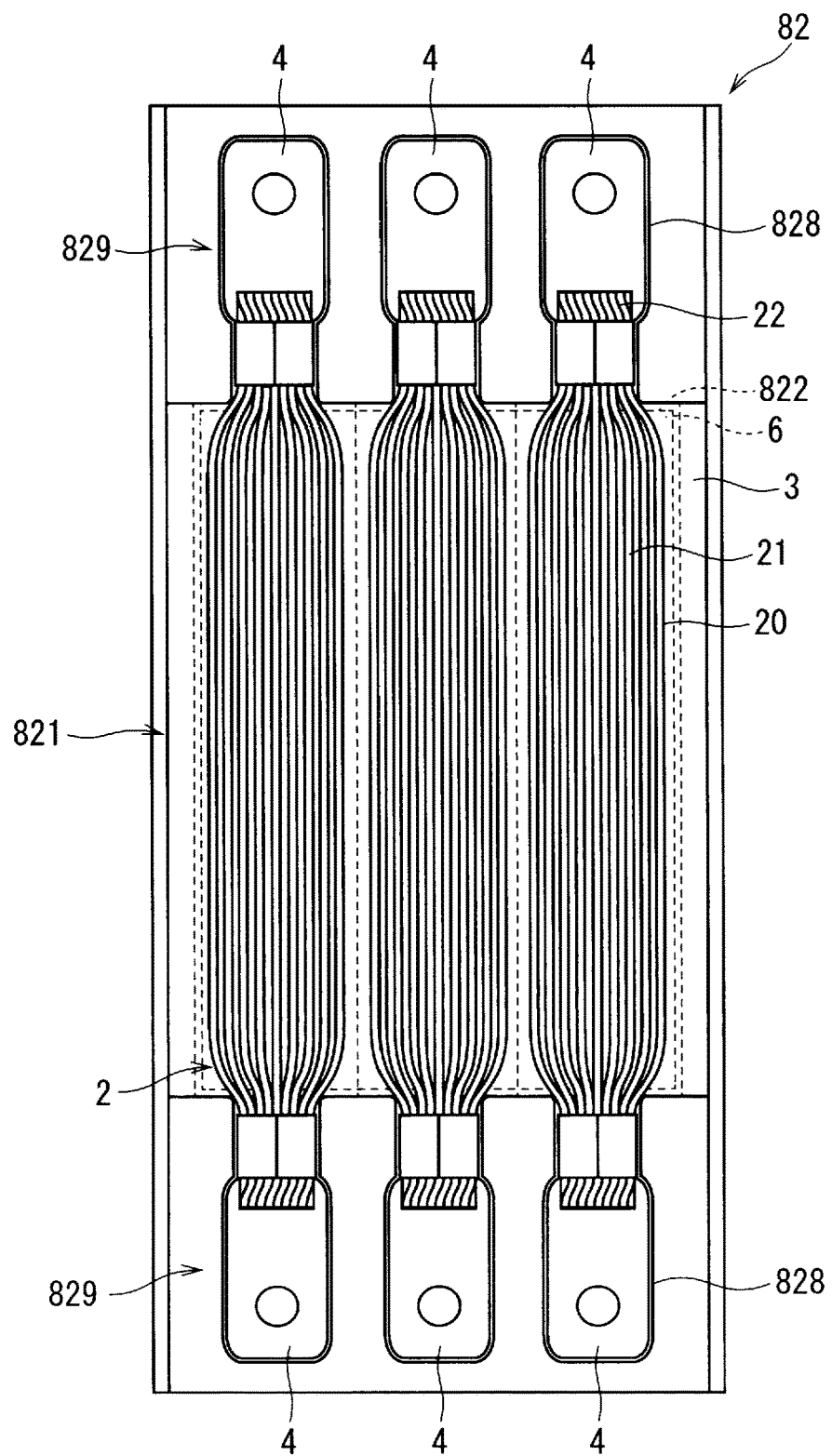
FIG. 7 is a plan view showing part of the manufacturing process of the terminal-equipped electrical cable according to the first embodiment.
Figure 8:
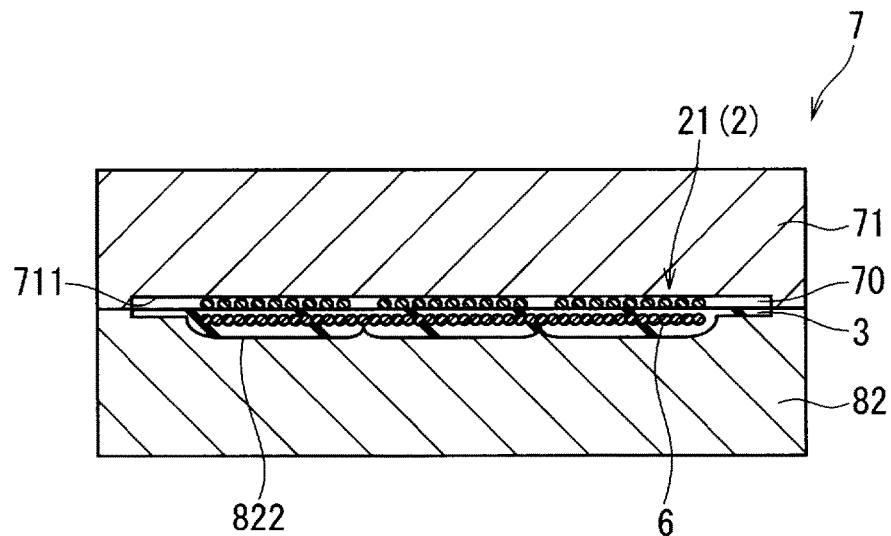
FIG. 8 is a cross-sectional view showing part of the manufacturing process of the terminal-equipped electrical cable according to the first embodiment.
Figure 9:
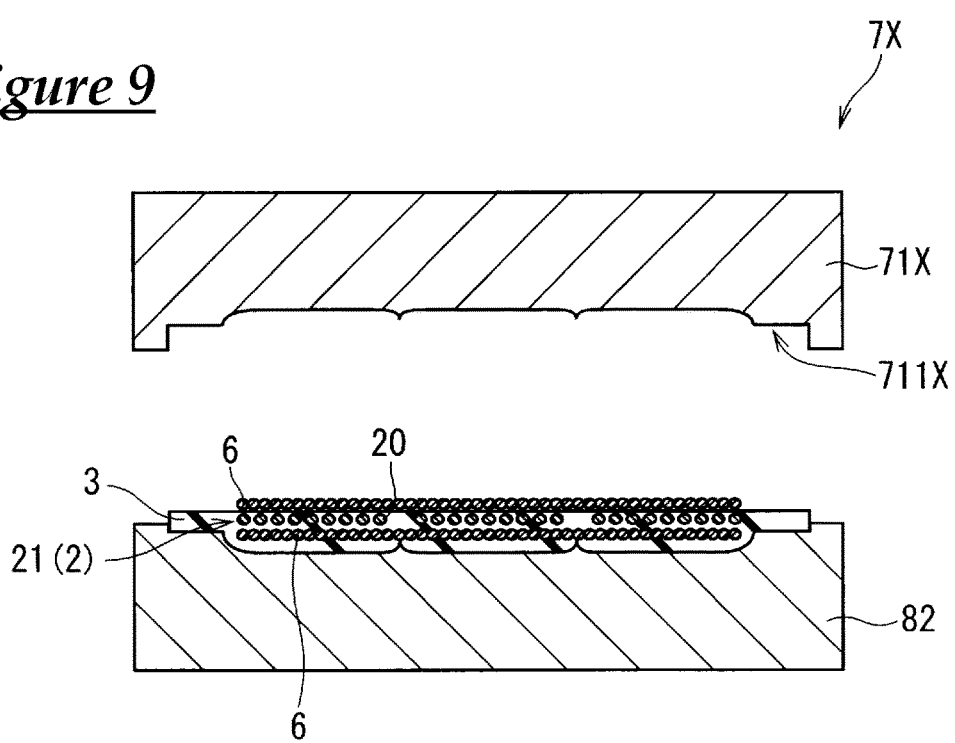
FIG. 9 is a cross-sectional view showing part of the manufacturing process of the terminal-equipped electrical cable according to the first embodiment.
Figure 10:
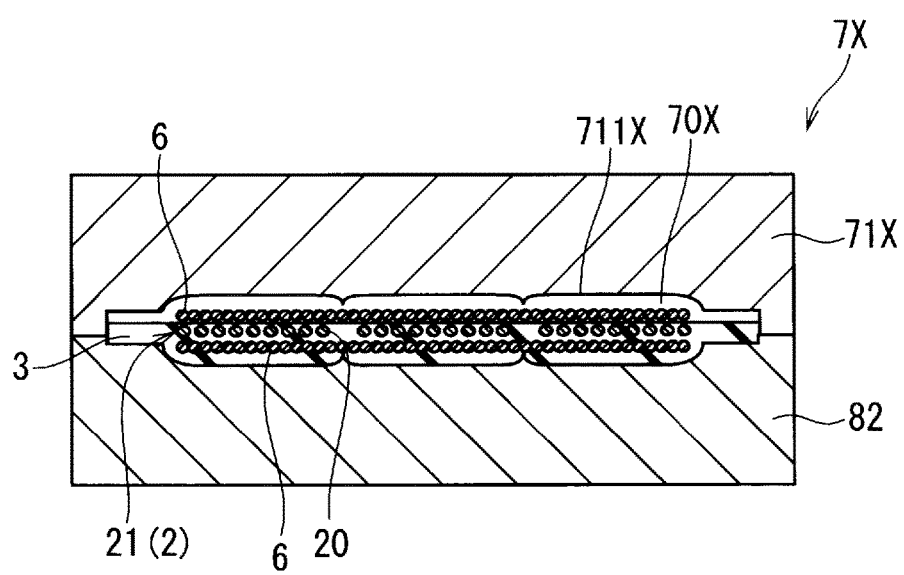
FIG. 10 is a cross-sectional view showing part of the manufacturing process of the terminal-equipped electrical cable according to the first embodiment.

In the present embodiment, the insulation member molding step includes a second step, a third step, and a fourth step. The second step, the third step, and the fourth step are steps of providing the insulation member 3 at the periphery of the electrical cable portions 2. FIG. 5 shows the second step of the method of manufacturing the terminal-equipped electrical cable. FIGS. 6 to 8 show the third step of the method of manufacturing the terminal-equipped electrical cable. FIGS. 9 and 10 show the fourth step of the method of manufacturing the terminal-equipped electrical cable.

In the method of manufacturing the terminal-equipped electrical cable of the present embodiment, a mold 7X is used in which a space (an accommodating space 70X), which is surrounded by an inside face following the contour of the insulation member 3 and is capable of accommodating the non-twisted portion 21, is formed. This mold 7X is used in the fourth step. Note that in the present embodiment, a case is disclosed in which the terminal-equipped electrical cable 100 includes the shield portion 6. Therefore, in the method of manufacturing the terminal-equipped electrical cable of the present embodiment, molds 7 and 8 are also used in addition to the mold 7X. The mold 8 is used in the second step. The mold 7 is used in the third step.

In the method of manufacturing the terminal-equipped electrical cable, the first step is a step of connecting the terminals 4 to the twisted portions 22 of the electrical cable portions 2. In the present embodiment, the terminal-equipped electrical cable 100 includes three of the electrical cable portions 2, so the first step is a step of connecting the terminals 4 to the twisted portions 22 of each of the plurality of electrical cable portions 2.

In the present embodiment, a case is described in which the terminal-equipped electrical cable 100 is manufactured using a plurality of the linear conductors 20 that have been twisted over their entire length in advance. In this case, for example, first, the terminals 4 are connected to one end portion. Thereafter, work of untwisting the middle portion is performed. At this time, the plurality of linear conductors 20 are gathered at one end portion, so it is easy to perform the work of untwisting.

The non-twisted portion 21 is provided by untwisting the middle portion of the plurality of linear conductors 20. The non-twisted portion 21 is provided in a state in which there is a gap between at least some of the plurality of linear conductors 20. Also, while maintaining a state in which at least some of the plurality of linear conductors 20 in the non-twisted portion 21 are spaced apart from each other, the plurality of linear conductors 20 are twisted together again at the end portion on the other side. As a result, the twisted portions 22 are provided at the end portion on the other side of the plurality of linear conductors 20. In the first step, the terminals 4 can also be connected to the twisted portions 22 at the end portion on this other side.

In the present embodiment, the electrical cable connection portions 41 of the terminals 4 and the twisted portions 22 of the electrical cable portion 2 can be connected by crimping. In the first step, the work of connecting the terminals 4 to the electrical cable portions 2 is performed using, for example, a crimping apparatus or the like.

Next, the mold 8 used in the method of manufacturing the terminal-equipped electrical cable will be described with reference to FIG. 5. The mold 8 includes an upper mold 81 and a lower mold 82 supported so as to be able to approach or separate from each other. FIG. 5 is a cross-sectional view in which the shield portion 6 exists between the upper mold 81 and the lower mold 82.

In the present embodiment, the mold 8 includes the upper mold 81 and the lower mold 82. In a state in which the upper mold 81 and the lower mold 82 are closest to each other, a space (an accommodating space 80) capable of accommodating the shield portion 6 is formed in the mold 8. Note that in the example shown in FIG. 5, one shield portion 6 is disposed in the accommodating space 80. The accommodating space 80 is a space formed surrounded by an inside face (a curved face 822) that follows part of the contour of the insulation member 3 of the terminal-equipped electrical cable 100 and is formed in the lower mold 82, and a flat face 811 formed in the upper mold 81.

In the present embodiment, the lower mold 82 includes an accommodating space forming area 821 where the accommodating space 80 is formed when the lower mold 82 is combined with the upper mold 81, and a terminal fixing portion 829 configured to fix the terminals 4.

The accommodating space forming area 821 of the lower mold 82 includes the curved face 822 that follows part of the contour of the insulation member 3 of the terminal-equipped electrical cable 100. As shown in FIG. 5, in the present embodiment, in the accommodating space forming area 821, the curved face 822 is formed following the outer circumferential face of the contour of one main face side of the flat insulation member 3.

Also, in the present embodiment, the terminal fixing portion 829 of the lower mold 82 includes recessed portions 828 that follow the contour of the terminals 4. When the terminals 4 are accommodated in the recessed portions 828, the position of the terminals 4 is fixed. In this state, the terminals 4 are sandwiched between the upper mold 81 and the lower mold 82, so that the terminals 4 can be fixed in the third step and the fourth step described later.

Also, in the present embodiment, the upper mold 81 includes the flat face 811 opposed to the inside face of the accommodating space forming area 821 of the lower mold 82. The flat face 811 of the upper mold 81 forms a part of the face surrounding the accommodating space 80.

In the present embodiment, as shown in FIG. 5, the second step is a step in which, in a state in which one shield portion 6 (hereinafter referred to as the shield portion 6 of one side) among the shield portions 6 respectively covering both sides of the electrical cable portions 2 is accommodated in the accommodating space 80 of the mold 8, molding resin that constitutes the insulation member 3 is injected into the accommodating space 80, and part of the insulation member 3 is molded.

In the second step, first, the shield portion 6 of one side is disposed in the accommodating space forming area 821 of the lower mold 82. At this time, for example, the shield portion 6 is provided in a tensioned state such that a gap is formed between the shield portion 6 and the curved face 822 of the accommodating space forming area 821 of the lower mold 82.

The upper mold 81 is brought near the lower mold 82 in a state in which the shield portion 6 of one side is disposed in the accommodating space forming area 821 of the lower mold 82. In a state in which the upper mold 81 and the lower mold 82 are closest to each other, the shield portion 6 of one side is accommodated in the accommodating space 80 of the mold 8. At this time, for example, it is conceivable that the position of the shield portion 6 of one side is determined so that a part of the shield portion 6 of one side is sandwiched between the upper mold 81 and the lower mold 82. In this case, in a state in which the upper mold 81 and the lower mold 82 are closest to each other, the state in which the shield portion 6 of one side is tensioned is maintained.

Then, the molding resin that constitutes the insulation member 3 is injected into the accommodating space 80. By filling the accommodating space 80 with this molding resin, the molding resin is supplied to the periphery of the shield portion 6 of one side. By hardening of this molding resin, part of the insulation member 3 is molded.

Next, the third step of the method of manufacturing the terminal-equipped electrical cable will be described with reference to FIGS. 6 to 8. In the third step, the mold 7 is used. The mold 7 includes an upper mold 71 and the lower mold 82 supported so as to be able to approach or separate from each other.

In the present embodiment, the mold 7 includes the upper mold 71 and the lower mold 82. The lower mold 82 of the mold 7 is the same as the lower mold 82 in the mold 8. Therefore, a description of the lower mold 82 will be omitted here.

FIG. 6 is a cross-sectional view of the shield portion 6 of one side, the electrical cable portions 2, and the insulation member 3 at the start of the third step. FIG. 7 is a plan view of the terminals 4 and the electrical cable portions 2 placed on the lower mold 82 after completion of the second step. FIG. 8 is a cross-sectional view of the shield portion 6, the electrical cable portions 2, and the insulation member 3 in the third step. Note that FIG. 6 shows the mold 7 in a state in which the upper mold 71 and the lower mold 82 are not close to each other, and FIG. 8 shows the mold 7 in a state in which the upper mold 71 and the lower mold 82 are closest to each other.

In a state in which the upper mold 71 and the lower mold 82 are closest to each other, a space (an accommodating space 70) capable of accommodating the non-twisted portions 21 of the plurality of electrical cable portions 2 is formed in the mold 7. Also, the upper mold 71 includes an accommodating space forming area 711 where the accommodating space 70 is formed when the upper mold 71 is combined with the lower mold 82. In the example shown in FIGS. 6 and 8, the accommodating space forming area 711 of the upper mold 71 includes a flat face opposing the curved face 822. That is, the accommodating space 70 is a space formed surrounded by the curved face 822 that follows part of the contour of the insulation member 3 of the terminal-equipped electrical cable 100 and is formed in the lower mold 82, and a face included in the accommodating space forming area 711 of the upper mold 71.

In the present embodiment, as shown in FIGS. 6 and 7, in the third step, the plurality of electrical cable portions 2 are placed on part of the insulation member 3 formed at the periphery of the shield portion 6 of one side that was obtained by the second step. That is, in the third step, the plurality of electrical cable portions 2 are placed on a flat face of part of the insulation member 3 that was obtained in the second step.

More specifically, after completion of the second step, the upper mold 81 is removed. Then, at least one of the terminals 4 that are connected to both end portions of the electrical cable portions 2 is fitted into a recessed portion 828 of the terminal fixing portion 829 of the lower mold 82. Thus, the position of the terminal 4 is determined.

Afterward, in a state in which part of the insulation member 3 that covers the periphery of the shield portion 6 of one side is accommodated in the lower mold 82, the electrical cable portions 2 are placed on part of the insulation member 3. Also note that the flat face of the insulation member 3 on which the electrical cable portions 2 are to be placed is a portion formed by the flat face of the upper mold 81.

More specifically, the non-twisted portions 21 formed by untwisting the portion between the twisted portions 22 at both end portions of the electrical cable portions 2 are disposed on a portion of the insulation member 3 that covers the periphery of the shield portion 6 of one side. Note that it is conceivable that at this time, while maintaining a state in which at least some of the plurality of linear conductors 20 in the non-twisted portions 21 are spaced apart from each other, the non-twisted portions 21 of the electrical cable portions 2 are disposed on part of the insulation member 3 that covers the periphery of the shield portion 6 of one side.

Also, in the present embodiment, the non-twisted portions 21 are provided by untwisting the plurality of linear conductors 20 that are in a state twisted in advance. Therefore, it is conceivable that there are kinks in the linear conductors 20 in the non-twisted portions 21. In this case, it is easy to maintain a state in which the plurality of linear conductors 20 are spaced apart from each other due to those kinks.

A case is also conceivable in which a partition portion that partitions the plurality of linear conductors 20 between the terminal fixing portion 829 and the accommodating space forming area 821 is provided in the lower mold 82 or the upper mold 71. It is conceivable that the partition portion is, for example, a plurality of wall-like portions or pin-like portions formed in the direction in which the linear conductors 20 are arranged. In this case, by disposing the linear conductors 20, for example, one by one between adjacent partition portions, contact of the linear conductors 20 can be suppressed by the partition portions, and it becomes easy to create a state in which the plurality of linear conductors 20 do not contact each other.

In a state in which the electrical cable portions 2 are disposed on a portion of the insulation member 3 that covers the periphery of the shield portion 6 of one side disposed in the accommodating space forming area 821 of the lower mold 82 such that the plurality of linear conductors 20 do not contact each other, the upper mold 71 is brought close to the lower mold 82. Thus, as shown in FIG. 8, a state is created in which the non-twisted portions 21 of the electrical cable portions 2 are accommodated in the accommodating space 70 of the mold 7.

Then, the molding resin that constitutes the insulation member 3 is injected into the accommodating space 80. In a state in which the molding resin has filled the accommodating space 80, the molding resin exists between the plurality of linear conductors 20. By hardening of this molding resin, part of the insulation member 3, which fills gaps between the plurality of linear conductors 20 in the non-twisted portions 21, and covers the periphery of the non-twisted portions 21, is molded.

Accordingly, the third step is a step in which, while maintaining a state in which at least some of the plurality of linear conductors 20 are spaced apart from each other, the molding resin that constitutes the insulation member 3 is injected into the accommodating space 70, and part of the insulation member 3 that covers the periphery of the non-twisted portions 21 and fills gaps between the plurality of linear conductors 20 in the non-twisted portions 21 is molded.

Also, in the present embodiment, in the third step, the shield portion 6 of one side is integrated with the electrical cable portions 2 by the insulation member 3. Therefore, the third step is also a step of providing the shield portion 6 of one side to the electrical cable portions 2. Note that in FIGS. 6 to 8, for the sake of convenience, the grounding conductor 68 connectable to the shield portion 6 is not shown.

Also, in the third step, the molding resin injected into the accommodating space 70 melts and mixes together with resin of the surface of the flat face of part of the insulation member 3 that was molded in the second step. In this state, by hardening of the molding resin injected into the accommodating space 70 in the third step, the non-twisted portions 21 of the electrical cable portions 2 and part of the insulation member 3 that covers the periphery of the shield portion 6 of one side can be obtained.

Next, the fourth step of the method of manufacturing the terminal-equipped electrical cable will be described with reference to FIG. 10. In the fourth step, the mold 7X is used. The mold 7X includes an upper mold 71X and the lower mold 82 supported so as to be able to approach or separate from each other. FIG. 10 is a cross-sectional view of the shield portions 6, the electrical cable portions 2, and the insulation member 3 in the fourth step. Note that in FIG. 10, the mold 7X is shown in a state in which the upper mold 71X and the lower mold 82 are closest to each other.

In the present embodiment, the mold 7X includes the upper mold 71X and the lower mold 82. The lower mold 82 of the mold 7X is the same as the lower mold 82 in the molds 7 and 8. Therefore, a description of the lower mold 82 will be omitted here.

In the present embodiment, the upper mold 71X includes an accommodating space forming area 711X where the accommodating space 70X is formed when the upper mold 71X is combined with the lower mold 82. The accommodating space forming area 711X of the upper mold 71X includes an inside face that follows a remaining portion of the contour of the insulation member 3 of the terminal-equipped electrical cable 100 with respect to the insulation member 3 molded by the second step and the third step. As shown in FIG. 10, in the present embodiment, the accommodating space forming area 711 includes an inside face (a curved face) that follows the outer peripheral face of the contour of the other main face side of the flat insulation member 3.

The fourth step is a step in which, while maintaining a state in which the non-twisted portions 21 of the electrical cable portions 2 do not contact the inside face of the mold 7X (the inside face of the accommodating space forming area 711X and the inside face of the accommodating space forming area 821), and a state in which at least some of the plurality of linear conductors 20 are spaced apart from each other, the molding resin that constitutes the insulation member 3 is injected into the accommodating space 70X, and the remaining portion of the insulation member 3 that covers the periphery of the non-twisted portions 21 and fills gaps between the plurality of linear conductors 20 in the non-twisted portions 21 is molded.

Also, in the present embodiment, in the fourth step, the shield portion 6 of the other side is integrated with the electrical cable portions 2 by the insulation member 3. Therefore, the fourth step is also a step of providing the shield portion 6 of the other side to the electrical cable portions 2. Note that in FIG. 10, for the sake of convenience, the grounding conductor 68 connectable to the shield portions 6 is not shown.

In the fourth step, first, the shield portion 6 of the other side is placed on the flat face of part of the insulation member 3 that covers the shield portion 6 of one side and the periphery of the non-twisted portions 21 obtained in the second step and the third step. More specifically, after completion of the third step, the upper mold 71 is removed, and then in a state in which the shield portion 6 of one side, the electrical cable portions 2, and part of the insulation member 3 are accommodated in the lower mold 82, the shield portion 6 of the other side is placed on part of the insulation member 3. Note that the flat face of part of the insulation member 3 is a portion formed by a flat face in the accommodating space forming area 711 of the upper mold 71 in the third step.

Then, in a state in which the shield portion 6 of the other side has been placed on part of the insulation member 3, the upper mold 71X is brought near the lower mold 82. Thus, as shown in FIG. 10, a state is created in which the two shield portions 6 and the non-twisted portions 21 of the electrical cable portions 2 are accommodated in the accommodating space 70X of the mold 7X. Note that in the present embodiment, the non-twisted portions 21 whose periphery is covered by part of the insulation member 3 and the shield portion 6 of one side are accommodated in the accommodating space 70X.

Then, the molding resin that constitutes the insulation member 3 is injected into the accommodating space 70X. In a state in which the molding resin has filled the accommodating space 70X, the shield portion 6 of the other side is formed integrated with the non-twisted portions 21 set in the lower mold 82 obtained in the third step, and part of the insulation member 3 that covers the periphery of the shield portion 6 of one side. Then, in the fourth step, by hardening of the molding resin, the insulation member 3 that collectively covers the non-twisted portions 21 of the electrical cable portions 2 and the periphery of the two shield portions 6 is molded.

Note that in the fourth step, the molding resin injected into the accommodating space 70X melts and mixes together with resin of the surface of the flat face of part of the insulation member 3 that was molded in the third step. In this state, by hardening of the molding resin injected into the accommodating space 70 in the fourth step, the remaining portion for part of the insulation member 3 that was molded in the third step is molded, and thus the insulation member 3 can be obtained.

After completion of the fourth step, a molded portion molding step is performed in which the molded portions 5 that cover the periphery of the connection portion connecting the terminals 4 to the electrical cable portions 2 are molded. By completing this molded portion molding step, it is possible to obtain the terminal-equipped electrical cable 100 of the present embodiment provided with the electrical cable 10, the terminals 4, the molded portions 5, and the two shield portions 6.

In the terminal-equipped electrical cable 100, the electrical cable portions 2 include the non-twisted portion 21, and the insulation member 3 fills gaps between the plurality of linear conductors 20 in the non-twisted portion 21. In this case, in the non-twisted portion 21 of the electrical cable portions 2, the force necessary in order to bend the plurality of linear conductors 20 provided in a dispersed state is small. Also, with the flexible insulation member 3 that fills gaps between the plurality of linear conductors 20 in the non-twisted portion 21, it is possible to suppress the plurality of linear conductors 20 in a dispersed state from coming into contact with each other and becoming difficult to bend. That is, in the present embodiment, the insulation member 3 made of a resin softer than metal is provided between the linear conductors 20. Therefore, in comparison to a case of bending the plurality of linear conductors 20 gathered together in a state in contact with each other, the electrical cable 10 of the present embodiment, in which the flexible insulation member 3 is interposed between the linear conductors 20, bends easily. In this case, the electrical cable 10 bends easily in a plurality of directions, and the flexibility of the electrical cable 10 can be improved. As a result, flexibility of the terminal-equipped electrical cable 100 can be improved.

Also, in the present embodiment, in the non-twisted portion 21, the plurality of linear conductors 20 are arranged in parallel in a direction orthogonal to the extension direction of the electrical cable portions 2. Conventionally, when a plurality of linear conductors 20 are arranged in parallel in a state in contact with each other, the linear conductors 20 are difficult to bend in the direction in which they are arranged. On the other hand, in the present embodiment, the linear conductors 20 arranged in parallel are partitioned by the flexible insulation member 3, so the electrical cable 10 bends easily also in the direction in which the linear conductors 20 are arranged. That is, the electrical cable 10 including the electrical cable portions 2 in which the plurality of linear conductors 20 are arranged in parallel is prevented from being difficult to bend in a direction orthogonal to the extension direction of the electrical cable portions 2 (the direction in which the linear conductors 20 are arranged). As a result, the electrical cable 10 bends easily in a plurality of directions, and the flexibility of the electrical cable 10 can be improved.

More specifically, in the present embodiment, in the non-twisted portion 21, the plurality of linear conductors 20 are arranged in parallel, so the dimension in the thickness direction of the non-twisted portion 21 is reduced, and bending in the thickness direction is easy.

In this regard, if a plurality of linear conductors are arranged in parallel in a state in contact with each other, the dimension in the direction in which the linear conductors are arranged in the non-twisted portion is increased, and bending becomes difficult in the direction in which the linear conductors are arranged. In this case, for example, in a state in which a terminal at one end portion of the electrical cable portion is fixed, it is difficult to move a terminal at the other end portion in the direction in which the linear conductors are arranged, so there is a concern that work to install the electrical cable portion and work to connect the terminal will be complicated.

On the other hand, in the present embodiment, the plurality of linear conductors 20 are provided with a space between them in the direction in which the plurality of linear conductors 20 are arranged. Also, the insulation member 3 is provided between the linear conductors 20. Therefore, it is possible to suppress the linear conductors 20 from contacting each other in the direction in which the plurality of linear conductors 20 are arranged. As a result, in the terminal-equipped electrical cable 100, it is possible to maintain a state in which the plurality of linear conductors 20 are dispersed inside the insulation member 3, so bending is easy even in the direction in which the plurality of linear conductors 20 are arranged. In this case, for example, in a state where one terminal 4 of an electrical cable portion 2 is fixed, a terminal 4 at the other end portion can be moved in the direction in which the linear conductors 20 are arranged.

Note that in FIG. 1, in a state in which the terminals 4 at one end portion of the electrical cable portions 2 are fixed, a state in which the terminals 4 at the other end portion have been moved in the direction in which the linear conductors 20 are arranged is indicated by an imaginary line (a double-dotted chained line). Thus, it is possible to suppress work to install the electrical cable portions 2 and work to connect the terminals 4 from becoming complicated.

Also, in the present embodiment, the insulation member 3 is provided in a flat shape, so the terminal-equipped electrical cable 100 including the electrical cable 10 can be easily laid in a location such as a gap having a small amount of space.

Also, in the present embodiment, the plurality of electrical cable portions 2 are collectively covered by the insulation member 3 in a state in which the plurality of electrical cable portions 2 are arranged in parallel with a space between them. In this case, the plurality of electrical cable portions 2 can be integrated together by the insulation member 3, so the handling performance of the electrical cable 10 is increased. As a result, the handling performance of the terminal-equipped electrical cable 100 is increased.

Also, in the present embodiment, the terminal-equipped electrical cable 100 is further provided with the shield portion 6 that covers at least one side (both sides in the present example) of the electrical cable portions 2 and is formed integrated with the electrical cable portions 2 by the insulation member 3. In this case, electromagnetic noise from at least one side of the electrical cable portions 2 can be shielded.

Also, in the present embodiment, the electrical cable portions 2 further include the twisted portions 22 provided in a state in which the plurality of linear conductors 20 are twisted in the connection portion connecting to the terminals 4. In this case, the plurality of linear conductors 20 are not dispersed in the connection portion connecting with the terminals 4, so it is possible to efficiently perform the work of connecting the electrical cable portions 2 to the terminals 4, and the connection state of the electrical cable portions 2 with the terminals 4 is stable.

Also, in the present embodiment, water can be stopped in the connection portion connecting the terminals 4 and the electrical cable portions 2 by the molded portions 5, which cover the connection portion connecting the terminals 4 and the electrical cable portions 2.

Also, in the present embodiment, the method of manufacturing the terminal-equipped electrical cable includes a step of molding the insulation member 3 that covers the periphery of the non-twisted portions 21 and fills gaps between the plurality of linear conductors 20 in the non-twisted portions 21 by injecting the molding resin into the accommodating spaces 70X, 70, and 80 while maintaining a state in which the non-twisted portions 21 are not contacting the inside face of the molds 7X, 7, and 8, and a state in which at least some of the plurality of linear conductors 20 are spaced apart from each other. In this case, it is possible to easily manufacture the terminal-equipped electrical cable 100 including the insulation member 3 that covers the periphery of the non-twisted portions 21 of the electrical cable portions 2, and fills gaps between the plurality of linear conductors 20 in the non-twisted portions 21.

Second Embodiment

Next, with reference to FIGS. 11 to 15, is a description of a method of manufacturing a terminal-equipped electrical cable according to a second embodiment of manufacturing the terminal-equipped electrical cable 100. The second embodiment differs from the first embodiment in that the second step and the third step of the first embodiment are combined. Below, points in the second embodiment that differ from the first embodiment will be described.

Below, steps corresponding to the above-described second step and third step are referred to as a fifth step for the sake of convenience. That is, in the method of manufacturing the terminal-equipped electrical cable of the second embodiment, the first step, the fifth step, and the fourth step are performed. The first step is the same as in the first embodiment, so a description of that step is omitted here.

In the method of manufacturing the terminal-equipped electrical cable of the second embodiment, the molds 7X and 8 of the first embodiment are used. The molds 7X and 8 are the same as those in the first embodiment, so a description of those molds is omitted here.

Note that the mold 7X is used in the fourth step in the method of manufacturing the terminal-equipped electrical cable of the second embodiment. Also, the mold 8 is used in the fifth step in the method of manufacturing the terminal-equipped electrical cable of the second embodiment.

Figure 11:
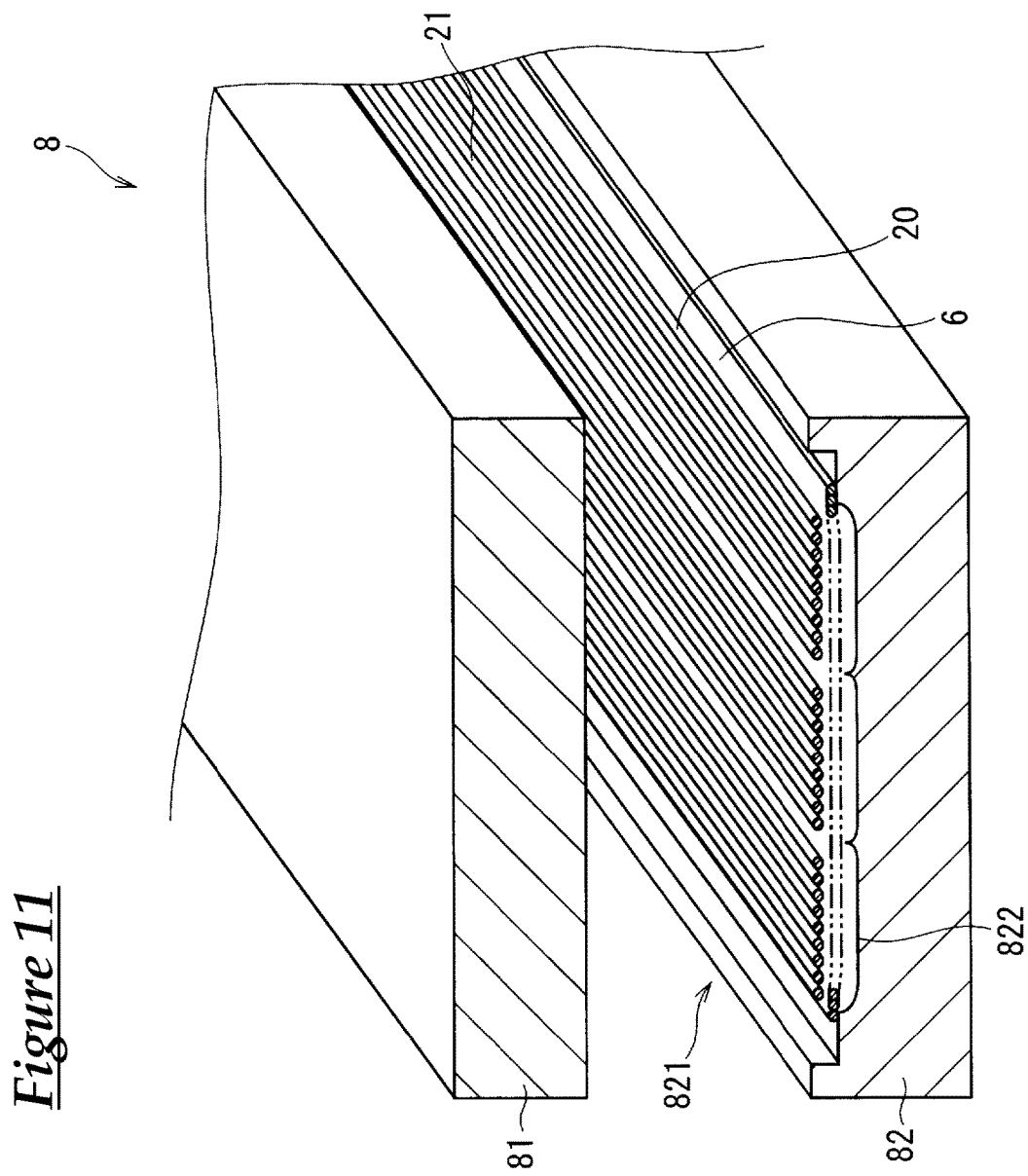
FIG. 11 is a partial cutaway perspective view showing part of a manufacturing process of a terminal-equipped electrical cable according to a second embodiment.
Figure 12:
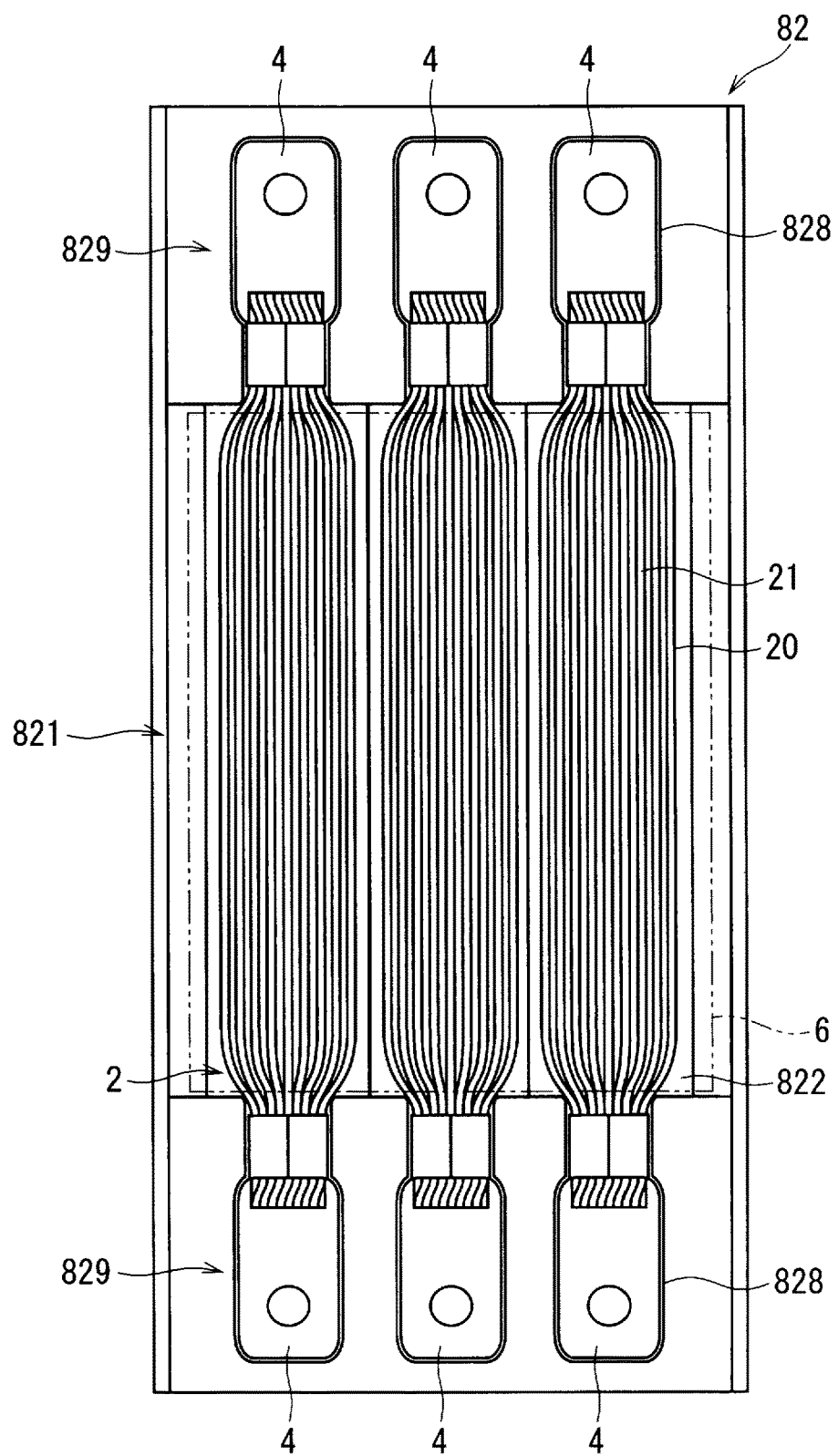
FIG. 12 is a plan view showing part of the manufacturing process of the terminal-equipped electrical cable according to the second embodiment.
Figure 13:
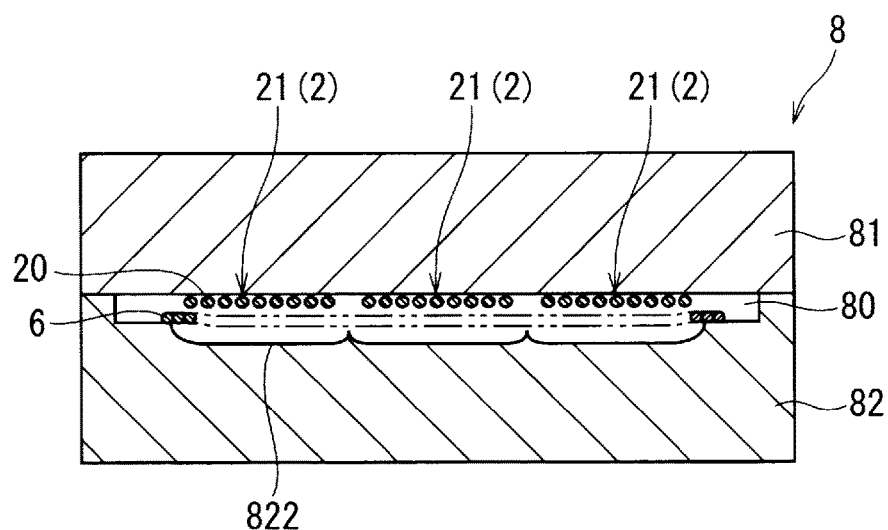
FIG. 13 is a cross-sectional view showing part of the manufacturing process of the terminal-equipped electrical cable according to the second embodiment.
Figure 14:
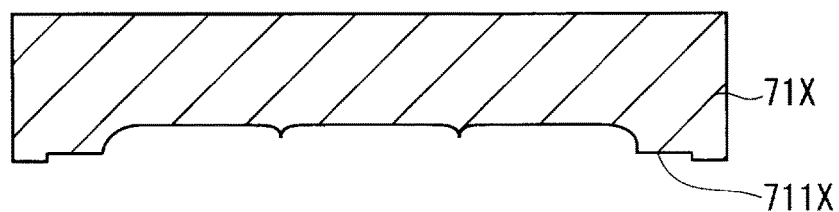
FIG. 14 is a cross-sectional view showing part of the manufacturing process of the terminal-equipped electrical cable according to the second embodiment.
Figure 14:
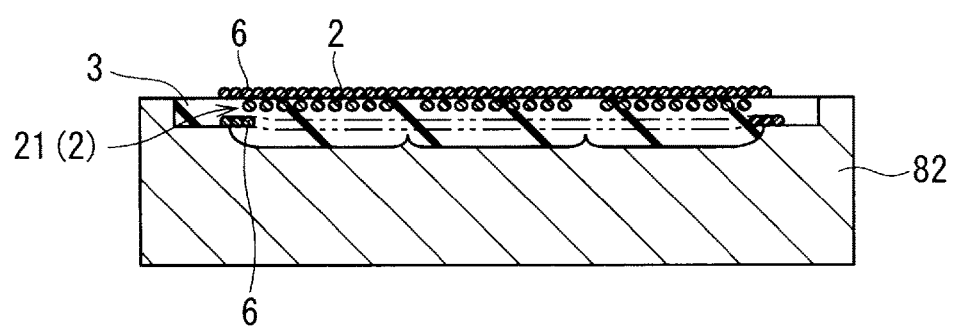
Figure 15:
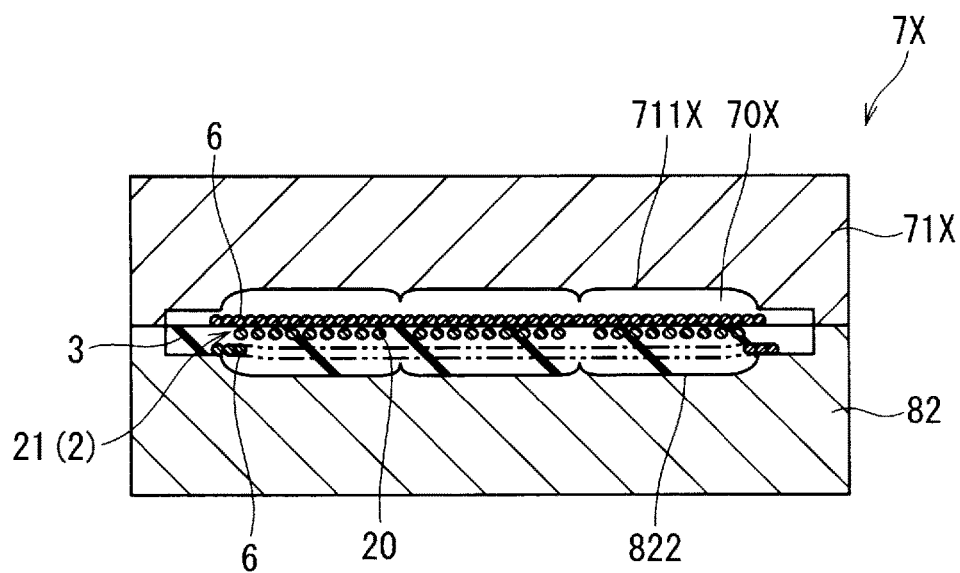
FIG. 15 is a cross-sectional view showing part of the manufacturing process of the terminal-equipped electrical cable according to the second embodiment.

FIG. 11 is a partial cutaway perspective view of the mold 8 at the start of the fifth step of the method of manufacturing the terminal-equipped electrical cable of the second embodiment. FIG. 12 is a plan view of the electrical cable portions 2 and the shield portion 6 disposed in the lower mold 82 of the mold 8 at the start of the fifth step. FIG. 13 is a cross-sectional view of the electrical cable portions 2, the shield portion 6, and the mold 8 in the fifth step. FIG. 14 is a cross-sectional view of the electrical cable portions 2, the shield portion 6, and the mold 7X at the start of the fourth step. FIG. 15 is a cross-sectional view of the electrical cable portions 2, the shield portion 6, and the mold 7X in the fourth step.

In the fifth step, as shown in FIGS. 11 and 12, first, the shield portion 6 of one side is disposed in the accommodating space forming area 821 of the lower mold 82. Note that in the present embodiment, by part of the shield portion 6 of one side being placed at both edge sides of the accommodating space forming area 821, a state is created in which a gap is formed between the shield portion 6 of one side and the curved face 822 of the accommodating space forming area 821 of the lower mold 82.

Note that as in the first embodiment, a case is also conceivable in which the shield portion 6 of one side is provided in a tensioned state such that a gap is formed between the shield portion 6 and the curved face 822 of the accommodating space forming area 821 of the lower mold 82. In this case, it is conceivable that the shield portion 6 of one side is provided at a position such that, for example, in a state in which the upper mold 81 and the lower mold 82 are closest to each other, part of the shield portion 6 of one side is sandwiched between the upper mold 81 and the lower mold 82, and the shield portion 6 of one side is maintained in a tensioned state.

In the second embodiment, in a state in which the non-twisted portions 21 of the electrical cable portions 2 are disposed in the accommodating space forming area 821, the plurality of linear conductors 20 are provided in a tensioned state such that they do not contact the accommodating space forming area 821 of the lower mold 82. Note that in the present embodiment, the shield portion 6 of one side is disposed on the lower mold 82 side of the non-twisted portions 21. Therefore, the above-described state in which the non-twisted portions 21 of the electrical cable portions 2 do not contact the accommodating space forming area 821 of the lower mold 82 has the same meaning as a state in which the non-twisted portions 21 of the electrical cable portions 2 do not contact the shield portion 6 of one side.

Note that even in a state in which the plurality of linear conductors 20 are tensioned, a state is maintained in which at least some of the plurality of linear conductors 20 in the non-twisted portions 21 are spaced apart from each other. That is, in the fifth step, a state is created in which the linear conductors 20 are disposed in the lower mold 82 in a tensioned state such that the plurality of linear conductors 20 do not come into contact with each other and the non-twisted portions 21 do not contact the shield portion 6 of one side.

More specifically, in the fifth step, at least one of the terminals 4 connected to both end portions of the electrical cable portions 2 is fitted into a recessed portion 828 of the terminal fixing portion 829 of the lower mold 82. Thus, the position of the terminal 4 is determined.

Then, while maintaining the non-twisted portions 21, which are formed by untwisting a portion between the twisted portions 22 at both end portions of the electrical cable portions 2, in an untwisted state, the non-twisted portions 21 are disposed in the accommodating space forming area 821 of the lower mold 82 such that they do not contact the shield portion 6 of one side.

In this regard, a state in which the non-twisted portions 21 of the electrical cable portions do not contact the shield portion 6 of one side can be created, for example, by adjusting the distance between the terminal fixing portions 829 of the lower mold 82. More specifically, the terminals 4 connected to both ends of the electrical cable portions 2 are fitted into the recessed portions 828 of the terminal fixing portion 829 of the lower mold 82, thereby fixing the end portions of the electrical cable portions 2. Therefore, by adjusting the position of the terminal fixing portion 829, while creating a state in which the non-twisted portions 21 float above the shield portion 6 of one side, it is possible to create a state in which the plurality of linear conductors 20 in the non-twisted portions 21 are tensioned without contacting with each other.

Also, in a case where the non-twisted portions 21 are provided by untwisting the plurality of linear conductors 20 in a state twisted in advance, it is conceivable that there are kinks in the linear conductors 20 in the non-twisted portions 21, so it is easy to maintain a state in which the plurality of linear conductors 20 are spaced apart from each other due to those kinks.

A case is also conceivable in which a partition portion that partitions the plurality of linear conductors 20 between the terminal fixing portion 829 and the accommodating space forming area 821 is provided in the lower mold 82 or the upper mold 71. It is conceivable that the partition portion is, for example, a plurality of wall-like portions or pin-like portions formed in the direction in which the linear conductors 20 are arranged. In this case, by disposing the linear conductors 20, for example, one by one between adjacent partition portions, contact of the linear conductors 20 can be suppressed by the partition portions, and it becomes easy to create a state in which the plurality of linear conductors 20 do not contact each other.

After the electrical cable portions 2 are placed on the lower mold 82 in a state in which the plurality of linear conductors 20 do not contact each other and the non-twisted portions 21 do not contact the shield portion 6 of one side, as shown in FIG. 13, the upper mold 81 is brought close to the lower mold 82. Thus, a state is created in which the non-twisted portions 21 of the electrical cable portions 2 and the shield portion 6 are accommodated in the accommodating space 80 of the mold 8.

Then, the molding resin that constitutes the insulation member 3 is injected into the accommodating space 80. In a state in which the molding resin has filled the accommodating space 80, the molding resin exists between the plurality of linear conductors 20. By hardening of this molding resin, part of the insulation member 3, which fills gaps between the plurality of linear conductors 20 in the non-twisted portions 21, and covers the periphery of the non-twisted portions 21, is molded.

Accordingly, the fifth step is a step in which, while maintaining a state in which the non-twisted portions 21 do not contact the inside face of the molds 7X and 8, and a state in which at least some of the plurality of linear conductors 20 are spaced apart from each other, the molding resin that constitutes the insulation member 3 is injected into the accommodating space 80, and part of the insulation member 3 that covers the periphery of the non-twisted portions 21 and fills gaps between the plurality of linear conductors 20 in the non-twisted portions 21 is molded. Also, in the present embodiment, in the fifth step, the shield portion 6 of one side is integrated with the electrical cable portions 2 by the insulation member 3. Accordingly, the fifth step is a step in which the shield portion 6 is provided to the electrical cable portions 2.

After completing the fifth step, as shown in FIGS. 14 and 15, the fourth step employing the mold 7X is performed. As in the first embodiment, in the fourth step, the shield portion 6 of the other side is placed on the flat face of part of the insulation member 3 that covers the shield portion 6 of one side and the periphery of the non-twisted portions 21 obtained in the fifth step. Then, after creating a state in which the two shield portions 6 and the non-twisted portions 21 of the electrical cable portions 2 are accommodated in the accommodating space 70X of the mold 7X, the molding resin that constitutes the insulation member 3 is injected into the accommodating space 70X. By hardening of the molding resin, the insulation member 3 is molded collectively covering the non-twisted portions 21 of the electrical cable portions 2 and the periphery of the two shield portions 6. As a result, the terminal-equipped electrical cable 100 can be obtained.

In the present embodiment as well, the method of manufacturing the terminal-equipped electrical cable includes steps (the fifth step and the fourth step) of molding the insulation member 3 that covers the periphery of the non-twisted portions 21 and fills gaps between the plurality of linear conductors 20 in the non-twisted portions 21 by injecting the molding resin into the accommodating space while maintaining a state in which the non-twisted portions 21 are not contacting the inside face of the molds 7X and 8, and a state in which at least some of the plurality of linear conductors 20 are spaced apart from each other. In this case, it is possible to easily manufacture the terminal-equipped electrical cable 100 including the insulation member 3 that covers the periphery of the non-twisted portions 21 of the electrical cable portions 2, and fills gaps between the plurality of linear conductors 20 in the non-twisted portions 21.

Third Embodiment

Figure 16:
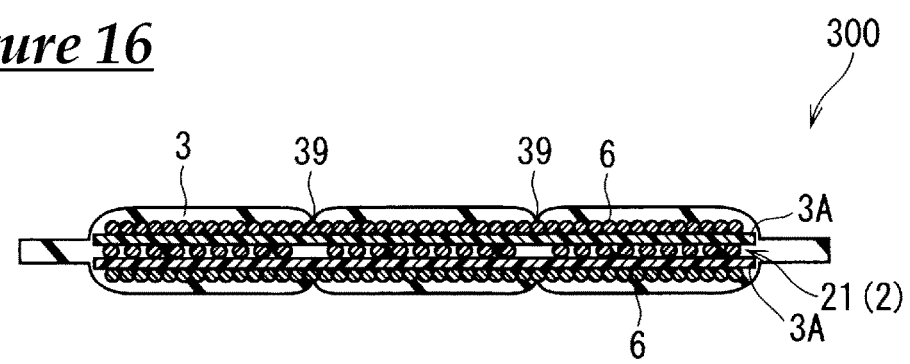
FIG. 16 is a cross-sectional view of a terminal-equipped electrical cable according to a third embodiment.
Figure 17:
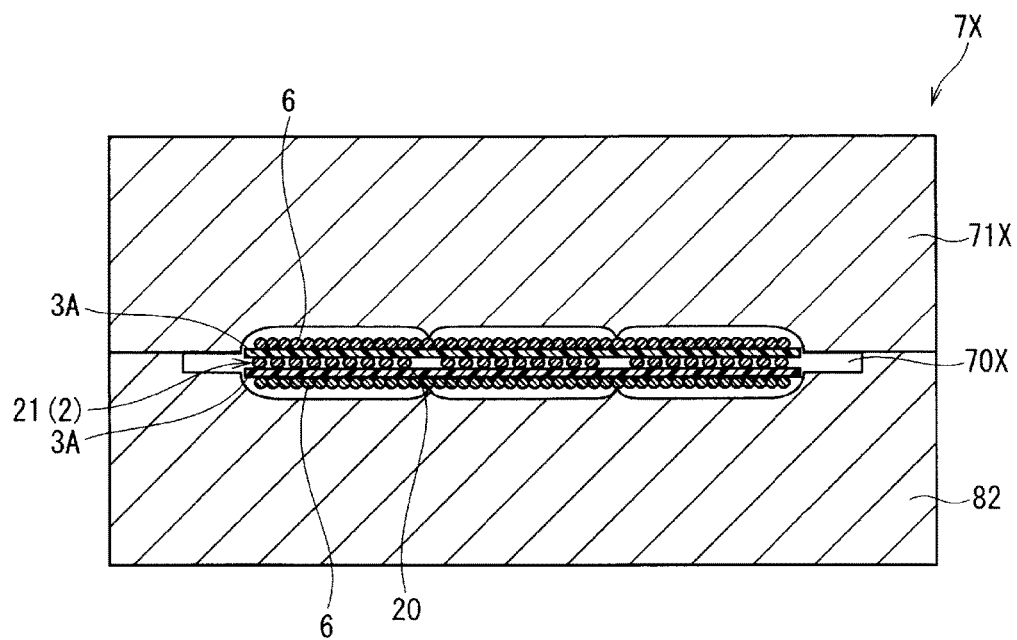
FIG. 17 is a cross-sectional view showing part of a manufacturing process of the terminal-equipped electrical cable according to the third embodiment.

Next, with reference to FIGS. 16 and 17, is a description of a terminal-equipped electrical cable 300 according to a third embodiment. The terminal-equipped electrical cable 300 differs from the first embodiment by being further provided with partition members 3A. FIG. 16 is a cross-sectional view of the terminal-equipped electrical cable 300. FIG. 17 is a cross-sectional view showing part of the manufacturing process of the terminal-equipped electrical cable 300. FIG. 17 is a cross-sectional view of the electrical cable portions 2, the shield portions 6, and the partition members 3A in a state existing between the upper mold 71X and the lower mold 82.

In the present embodiment, the terminal-equipped electrical cable 300 is provided with the electrical cable portions 2, the insulation member 3, the terminals 4, the molded portions 5, the shield portions 6, and the partition members 3A. Note that for the sake of convenience, the terminals 4 and the molded portions 5 do not appear in FIGS. 16 and 17. The structures of the electrical cable portions 2, the insulation member 3, the terminals 4, the molded portions 5, and the shield portions 6 are the same as those of the first embodiment, so a description thereof will be omitted here.

In the present embodiment, the partition members 3A are provided between the non-twisted portions 21 of the electrical cable portions 2 and the shield portions 6. The partition members 3A are members that suppress contact between the electrical cable portions 2 and the shield portions 6. The partition members 3A are formed integrated with the electrical cable portions 2 and the shield portions 6 by the insulation member 3. That is, the non-twisted portions 21 of the electrical cable portions 2, the shield portions 6, and the partition members 3A are provided inside the insulation member 3.

It is conceivable that the partition members 3A are, for example, sheet-like insulation members. It is conceivable that the partition members 3A are, for example, members containing the same resin material as the insulation member 3. It is also conceivable that the partition members 3A are members containing a resin material different from that of the insulation member 3.

Also, in the present embodiment, the partition members 3A are provided on both sides of the electrical cable portions 2. Therefore, the non-twisted portions 21 of the electrical cable portions 2 are interposed between the partition members 3A on both sides.

Next, a method of manufacturing the terminal-equipped electrical cable 300 of the present embodiment will be described. FIG. 16 shows part of the manufacturing process of the terminal-equipped electrical cable 300 of the present embodiment. In the present embodiment as well, as in the first embodiment, first, a first step of connecting the terminals 4 to the twisted portions 22 of the electrical cable portions 2 is performed.

In the present embodiment, the second step performed after the first step is a step in which, while maintaining a state in which the non-twisted portions 21 of the electrical cable portions 2 are not contacting the inside face of the mold 7X, and a state in which at least some of the plurality of linear conductors 20 are spaced apart from each other, the molding resin that constitutes the insulation member 3 is injected into the accommodating space 70X, and the insulation member 3 that covers the periphery of the non-twisted portions 21 and fills gaps between the plurality of linear conductors 20 in the non-twisted portions 21 is molded. That is, in the method of manufacturing the terminal-equipped electrical cable according to the present embodiment, a step employing the molds 7 and 8 is not performed.

In the present embodiment, as in the second embodiment, the plurality of linear conductors 20 are provided in a tensioned state such that the non-twisted portions 21 do not contact the inside face of the accommodating space forming area 821 of the lower mold 82. Also, by adjusting the position of the terminal fixing portion 829, a state is created in which the non-twisted portions 21 are floating above the lower mold 82, and in which the plurality of linear conductors 20 in the non-twisted portions 21 are not in contact with each other.

Also, as shown in FIG. 17, in the present embodiment, the partition members 3A are provided such that the non-twisted portions 21 of the electrical cable portions 2 in a state floating above the lower mold 82 are interposed between the partition members 3A. That is, the partition members 3A are provided so as to sandwich the non-twisted portions 21.

Also, the shield portions 6 are provided on the partition members 3A. It is conceivable that the shield portions 6 are fixed to the partition members 3A by, for example, an adhesive, an adhesive member, or the like.

In the present embodiment, it is possible to create a state in which the non-twisted portions 21 of the electrical cable portions 2 and the shield portions 6 are partitioned by the partition members 3A in the accommodating space 70X. In this state, the molding resin that constitutes the insulation member 3 is injected into the accommodating space 70X, and by hardening of the molding resin injected into the accommodating space 70X, the insulation member 3 can be obtained.

Here, in the present embodiment, as shown in FIG. 17, the size of the partition members 3A in a plan view is smaller than the size of the accommodating space forming area 821 of the lower mold 82. Therefore, a gap from the space on the upper mold 71X side to the space on the lower mold 82 side is formed at the periphery of the partition members 3A. Therefore, the molding resin injected into the accommodating space 70X does not remain in one space among the space on the upper mold 71X side and the space on the lower mold 82 side, and flows into the periphery of the non-twisted portions 21 of the electrical cable portions 2, the partition members 3A, and the shield portions 6. By the molding resin hardening in this state, it is possible to obtain the insulation member 3 that collectively covers the periphery of the non-twisted portions 21 of the electrical cable portions 2, the partition members 3A, and the shield portions 6.

Note that in a case where the partition members 3A are members containing the same resin as the insulation member 3, it is also conceivable that part of the insulation member 3 is constituted by the partition members 3A melting and then hardening again.

It is also conceivable that a mesh is formed in the partition members 3A. In this case, the molding resin passes through the mesh of the partition members 3A to flow from the space on the upper mold 71X side to the space on the lower mold 82 side.

In the present embodiment as well, in the non-twisted portions 21 of the electrical cable portions 2, the force necessary in order to bend the plurality of linear conductors 20 provided in a dispersed state is small. Also, with the flexible insulation member 3 that fills gaps between the plurality of linear conductors 20 in the non-twisted portions 21, it is possible to suppress the plurality of linear conductors 20 in a dispersed state from coming into contact with each other and becoming difficult to bend. In this case, the electrical cable 10 bends easily in a plurality of directions, and the flexibility of the electrical cable 10 can be improved. As a result, flexibility of the terminal-equipped electrical cable 100 can be improved.

Also, in the present embodiment, with the partition members 3A to be provided between the non-twisted portions 21 of the electrical cable portions 2 and the shield portions 6, the step of molding the insulation member 3 can be performed in a single operation. In this case, it is possible to shorten the time needed to manufacture the terminal-equipped electrical cable 300.

APPLICATION EXAMPLES

In the terminal-equipped electrical cable 100, a case is also conceivable in which the electrical cable 10 is not provided with a shield portion 6. Also, in the terminal-equipped electrical cables 100 and 300, a case is also conceivable in which a shield portion 6 covers only one side of the electrical cable portions 2. In this case, it is conceivable that the second step in the method of manufacturing the terminal-equipped electrical cable is omitted, for example.

Note that in the electrical cable, the terminal-equipped electrical cable, and the method of manufacturing the terminal-equipped electrical cable according to the present invention, within the scope of the invention described in the claims, the above-described embodiments and application examples can be freely combined, or alternatively, each embodiment and application example can be appropriately modified or a portion thereof can be omitted.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

REFERENCE SIGNS LIST

10 Electrical cable
100 Terminal-equipped electrical cable
2 Electrical cable portion
20 Linear conductor
300 Terminal-equipped electrical cable
21 Non-twisted portion
22 Twisted portion
3 Insulation member
4 Terminal
5 Molded portion
6 Shield portion
7 Mold
70 Accommodating space
7X Mold
70X Accommodating space
8 Mold
80 Accommodating space

The invention claimed is:

1. An electrical cable, comprising:
   an electrical cable portion having a plurality of linear conductors configured to be connected to a common connection point;
   a shield portion configured to cover at least one side of a periphery of the electrical cable portion; and
   a flexible insulation member configured to cover the periphery of the electrical cable portion;
   wherein a middle portion between both ends of the electrical cable portion has a non-twisted portion where at least some among the plurality of linear conductors are provided in a state spaced apart from each other,
   the shield portion does not completely surround the non-twisted portion of the electrical cable portion, and
   the insulation member covers a periphery of the non-twisted portion of the electrical cable portion, fills gaps between the plurality of linear conductors in the non-twisted portion, and covers a periphery of the shield portion.

2. The electrical cable according to claim 1,
   wherein in the non-twisted portion, the plurality of linear conductors are arranged in parallel in a direction orthogonal to an extension direction of the electrical cable portion.

3. The electrical cable according to claim 1,
   wherein the insulation member is formed in a flat shape.

4. The electrical cable according to claim 1,
   wherein a plurality of the electrical cable portions are provided, and
   in a state in which the plurality of electrical cable portions are arranged in parallel with a space between each other, the plurality of electrical cable portions are collectively covered by the insulation member.

5. The electrical cable according to claim 1, wherein the shield portion is formed integrated with the electrical cable portion by the insulation member.

6. A terminal-equipped electrical cable, comprising:
   the electrical cable according to claim 1; and
   at least one terminal connected to an end portion of the electrical cable portion;
   wherein the electrical cable portion further includes, in a connection portion thereof connecting with the terminal, a twisted portion where the plurality of linear conductors are provided in a twisted state.

7. The terminal-equipped electrical cable according to claim 6, further comprising:
   a molded portion that covers a periphery of the connection portion connecting the electrical cable portion and the terminal.

8. A terminal-equipped electrical cable manufacturing method of manufacturing the terminal-equipped electrical cable according to claim 6, employing a mold in which a space is formed surrounded by an inside face that follows a contour of the insulation member and the space is capable of accommodating the non-twisted portion, the method comprising:
   connecting the terminal to the twisted portion of the electrical cable portion; and
   molding the insulation member that covers a periphery of the non-twisted portion and fills gaps between the plurality of linear conductors in the non-twisted portion by injecting a molding resin into the space while maintaining a state in which the non-twisted portion is not in contact with an inside face of the mold, and a state in which at least some among the plurality of linear conductors are spaced apart from each other.

* * * * *